US012324179B2

(12) United States Patent
Sriram

(10) Patent No.: US 12,324,179 B2
(45) Date of Patent: Jun. 3, 2025

(54) GROUP III-NITRIDE HIGH-ELECTRON MOBILITY TRANSISTORS WITH A BURIED METALLIC CONDUCTIVE MATERIAL LAYER AND PROCESS FOR MAKING THE SAME

(71) Applicant: WOLFSPEED, INC., Durham, NC (US)

(72) Inventor: Saptharishi Sriram, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 582 days.

(21) Appl. No.: 17/552,555

(22) Filed: Dec. 16, 2021

(65) Prior Publication Data
US 2023/0197841 A1 Jun. 22, 2023

(51) Int. Cl.
H10D 30/47 (2025.01)
H10D 30/01 (2025.01)
H10D 62/10 (2025.01)
H10D 62/824 (2025.01)
H10D 62/85 (2025.01)
H10D 64/00 (2025.01)

(52) U.S. Cl.
CPC ......... *H10D 30/475* (2025.01); *H10D 30/015* (2025.01); *H10D 62/112* (2025.01); *H10D 62/824* (2025.01); *H10D 62/8503* (2025.01); *H10D 64/111* (2025.01)

(58) Field of Classification Search
CPC ............. H01L 29/7786; H01L 29/0638; H01L 29/2003; H01L 29/205; H01L 29/402; H01L 29/66462; H01L 29/423; H01L 29/7783; H01L 29/0843; H01L 29/41758; H01L 29/41766; H01L 29/42316
See application file for complete search history.

(56) References Cited

U.S. PATENT DOCUMENTS 3,748,545 A * 7/1973 Beale ...................... H01L 21/74
257/652
8,030,666 B2 * 10/2011 Chen .................. H01L 21/02381
257/E33.025
8,772,831 B2 * 7/2014 Chen ................... H01L 21/0254
257/191

(Continued)

OTHER PUBLICATIONS

Yan et al.; "GaN/NbN epitaxial semiconductor/superconductor heterostructures"; Nature; vol. 555 Issue 7695; Mar. 2018; p. 183-189.

Primary Examiner — Caleb E Henry
(74) Attorney, Agent, or Firm — BakerHostetler

(57) ABSTRACT

An apparatus includes a substrate; a group III-Nitride buffer layer on the substrate; a group III-Nitride barrier layer on the group III-Nitride buffer layer, the group III-Nitride barrier layer may include a higher bandgap than a bandgap of the group III-Nitride buffer layer; a source electrically coupled to the group III-Nitride barrier layer; a gate electrically coupled to the group III-Nitride barrier layer; a drain electrically coupled to the group III-Nitride barrier layer; and a conductive metallic region being at least one of the following: in the substrate or on the substrate below said group III-Nitride barrier layer. Additionally, the conductive metallic region is structured and arranged to extend a limited length parallel to said group III-Nitride barrier layer.

35 Claims, 17 Drawing Sheets

(56) References Cited

U.S. PATENT DOCUMENTS

| | | | |
|---|---|---|---|
| 8,809,909 B2* | 8/2014 | Briere | H01L 29/7786 257/E29.249 |
| 8,815,715 B2* | 8/2014 | Herman | H01L 21/78 438/758 |
| 9,018,056 B2* | 4/2015 | Kub | H01L 21/0262 257/E21.407 |
| 9,048,303 B1* | 6/2015 | Ostermaier | H01L 29/0657 |
| 9,233,844 B2* | 1/2016 | Chen | B82Y 10/00 |
| 9,443,969 B2* | 9/2016 | Wong | H10D 30/475 |
| 9,608,160 B1* | 3/2017 | Bayram | H01S 5/34333 |
| 9,698,365 B2* | 7/2017 | Seo | H10K 85/342 |
| 9,935,175 B1* | 4/2018 | Lee | H01L 21/02458 |
| 10,153,362 B2* | 12/2018 | Curatola | H01L 29/1066 |
| 2002/0074935 A1* | 6/2002 | Kwong | H10K 50/12 313/504 |
| 2002/0086180 A1* | 7/2002 | Seo | H10K 50/11 428/917 |
| 2005/0077512 A1* | 4/2005 | Yoon | H01L 33/007 257/E21.127 |
| 2006/0118819 A1* | 6/2006 | Hanson | H01L 29/7787 257/E29.081 |
| 2006/0194077 A1* | 8/2006 | Noguchi | H10K 50/11 428/917 |
| 2006/0251919 A1* | 11/2006 | Aziz | H10K 50/11 313/506 |
| 2008/0135804 A1* | 6/2008 | Qiu | H05B 33/14 252/301.16 |
| 2010/0096668 A1* | 4/2010 | Briere | H01L 21/8258 257/E29.246 |
| 2010/0243991 A1* | 9/2010 | Nauka | C09K 11/02 257/E51.026 |
| 2010/0244673 A1* | 9/2010 | Nomura | H05B 33/14 313/504 |
| 2011/0241020 A1* | 10/2011 | Saunier | H01L 21/8252 257/77 |
| 2011/0284868 A1* | 11/2011 | Briere | H01L 29/7787 257/E29.091 |
| 2013/0078783 A1* | 3/2013 | Nieh | H01L 21/76224 257/E21.546 |
| 2013/0112990 A1* | 5/2013 | Weeks, Jr. | C30B 25/18 257/76 |
| 2014/0014967 A1* | 1/2014 | Chen | H01L 21/02488 257/E29.081 |
| 2014/0159116 A1* | 6/2014 | Briere | H01L 29/7786 257/194 |
| 2015/0372124 A1* | 12/2015 | Isobe | H10D 62/60 257/192 |
| 2016/0351684 A1* | 12/2016 | Chiu | H01L 23/291 |
| 2017/0170283 A1* | 6/2017 | Laboutin | H01L 21/02458 |
| 2017/0330808 A1* | 11/2017 | Heider | G01B 11/24 |
| 2018/0040505 A1* | 2/2018 | Gaan | H01L 21/76283 |
| 2019/0198796 A1* | 6/2019 | Kim | H10K 50/805 |
| 2019/0229187 A1* | 7/2019 | Sriram | H10D 62/371 |
| 2019/0237569 A1* | 8/2019 | Sriram | H10D 64/411 |
| 2021/0359118 A1* | 11/2021 | Radulescu | H01L 29/41766 |
| 2021/0384345 A1* | 12/2021 | Chen | H01L 29/2003 |
| 2022/0375874 A1* | 11/2022 | Chen | H01L 29/205 |

\* cited by examiner

GROUP III-NITRIDE HIGH-ELECTRON MOBILITY TRANSISTORS WITH A BURIED METALLIC CONDUCTIVE MATERIAL LAYER AND PROCESS FOR MAKING THE SAME

FIELD OF THE DISCLOSURE

The disclosure relates to microelectronic devices and more particularly to gallium nitride high-electron mobility transistors with a buried conductive material layer. The disclosure also relates to a process of making microelectronic devices and more particularly to a process of making gallium nitride high-electron mobility transistors with a buried conductive material layer.

BACKGROUND OF THE DISCLOSURE

Group III-Nitride based or gallium nitride (GaN) based high-electron mobility transistors (HEMTs) are very promising candidates for high power radiofrequency (RF) applications, both in discrete and MMIC (Monolithic Microwave Integrated Circuit) forms. Current GaN HEMT designs use buffer layers that include traps to achieve desired breakdown. However, these traps cause memory effects that adversely affect performance. In particular, these designs show some trapping associated with what is called a "lag effect."

Many designs currently use deep level impurities such as iron (Fe) or carbon (C) to minimize leakage current through the buffer layer at high drain voltage conditions. However, both Fe and C lead to drain lag effect, which is the slow recovery of drain current when the drain voltage is changed from a high value to a lower one. This is very undesirable for both power and RF applications since it leads to lower switching current, lower efficiency, and other problems. In telecommunication applications, such drain lag effect, can lead to distortion and also complicates pre-distortion correction schemes. The drain lag effect may be eliminated by using high purity buffer layers without Fe or C. However, these devices have high leakage current through the buffer layer, which is also not acceptable.

Accordingly, there is a need for a solution to addressing a lag effect and/or other negative performance issues in Group-III nitride HEMTs and improving the performance of such devices.

SUMMARY OF THE DISCLOSURE

One general aspect includes an apparatus that includes a substrate; a group III-Nitride buffer layer on the substrate; a group III-Nitride barrier layer on the group III-Nitride buffer layer, the group III-Nitride barrier layer may include a higher bandgap than a bandgap of the group III-Nitride buffer layer; a source electrically coupled to the group III-Nitride barrier layer; a gate electrically coupled to the group III-Nitride barrier layer; a drain electrically coupled to the group III-Nitride barrier layer; and a conductive metallic region being at least one of the following: in the substrate or on the substrate below said group III-Nitride barrier layer, where the conductive metallic region is structured and arranged to extend a limited length parallel to said group III-Nitride barrier layer.

One general aspect includes an apparatus that includes a substrate; a group III-Nitride buffer layer on the substrate; a group III-Nitride barrier layer on the group III-Nitride buffer layer, the group III-Nitride barrier layer may include a higher bandgap than a bandgap of the group III-Nitride buffer layer; a source electrically coupled to the group III-Nitride barrier layer; a gate electrically coupled to the group III-Nitride barrier layer; a drain electrically coupled to the group III-Nitride barrier layer; and a superconducting material region being at least one of the following: in the substrate or on the substrate below said group III-Nitride barrier layer, where the superconducting material region is structured and arranged to extend a limited length parallel to said group III-Nitride barrier layer.

One general aspect includes a method of making a device that includes providing a substrate; providing a group III-Nitride buffer layer on the substrate; providing a group III-Nitride barrier layer on the group III-Nitride buffer layer, the group III-Nitride barrier layer may include a higher bandgap than a bandgap of the group III-Nitride buffer layer; electrically coupling a source to the group III-Nitride barrier layer; electrically coupling a gate to the group III-Nitride barrier layer; electrically coupling a drain to the group III-Nitride barrier layer; and providing a conductive metallic region being at least one of the following: in the substrate or on the substrate below said group III-Nitride barrier layer, where the conductive metallic region is structured and arranged to extend a limited length parallel to said group III-Nitride barrier layer.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
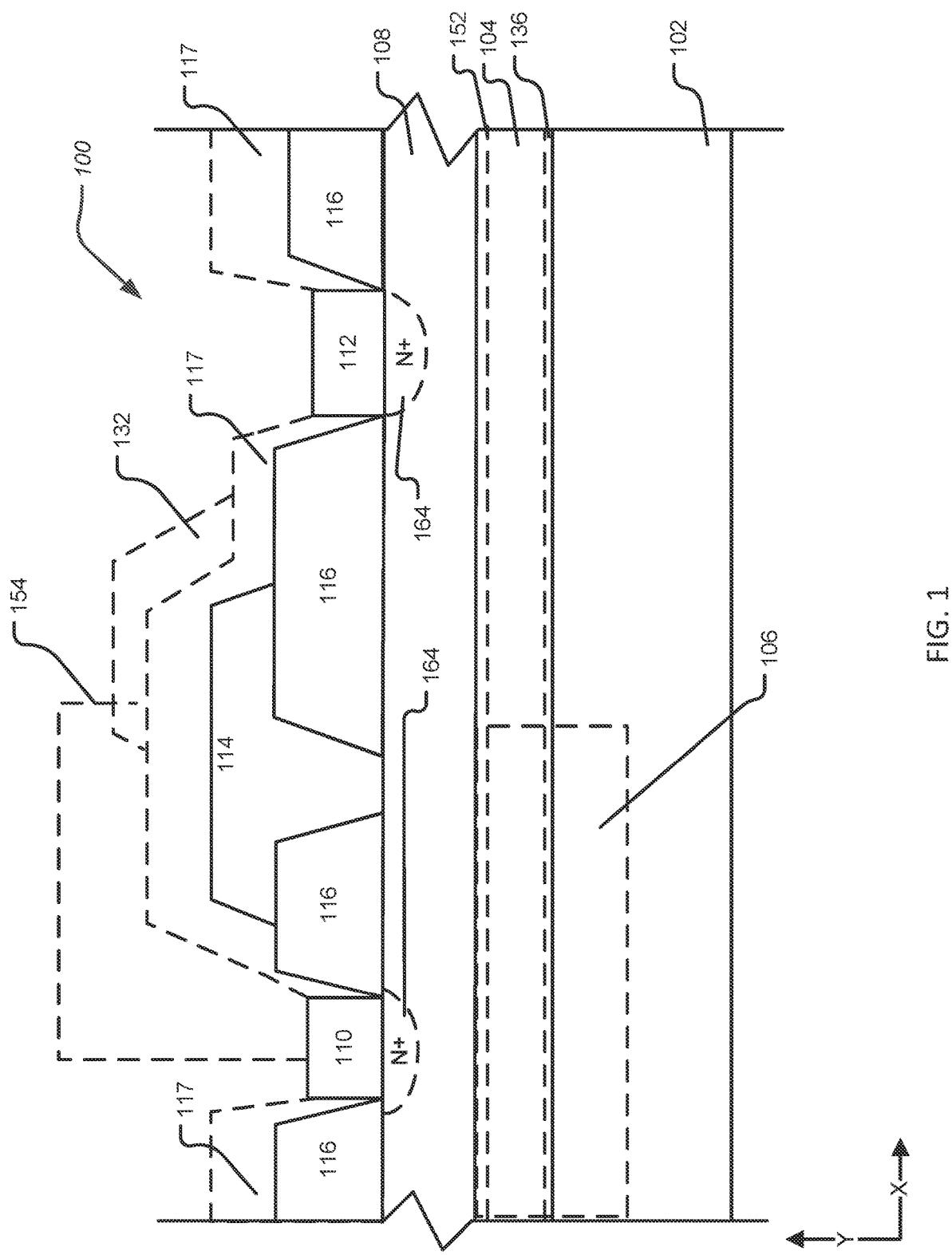
FIG. 1 shows a cross-sectional view of an aspect of a transistor according to the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects, as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings and in the different aspects disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

In addition to the type of structure, the characteristics of the semiconductor material from which a transistor is formed may also affect operating parameters. Of the characteristics that affect a transistor's operating parameters, the electron mobility, saturated electron drift velocity, electric breakdown field, and thermal conductivity may have an effect on a transistor's high frequency and high power characteristics.

Electron mobility is the measurement of how rapidly an electron is accelerated to its saturated velocity in the presence of an electric field. In the past, semiconductor materials, which had a high electron mobility, were preferred because more current could be developed with a lesser field, resulting in faster response times when a field is applied. Saturated electron drift velocity is the maximum velocity that an electron can obtain in the semiconductor material. Materials with higher saturated electron drift velocities are preferred for high frequency applications because the higher velocity translates to shorter times from source to drain.

Electric breakdown field is the field strength at which breakdown of the Schottky junction and the current through the gate of the device suddenly increases. A high electric breakdown field material is preferred for high power, high frequency transistors because larger electric fields generally can be supported by a given dimension of material. Larger electric fields allow for faster transients as the electrons can be accelerated more quickly by larger electric fields than by smaller ones.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

The disclosure includes both extrinsic and intrinsic semiconductors. Intrinsic semiconductors are undoped (pure). Extrinsic semiconductors are doped, meaning an agent has been introduced to change the electron and hole carrier concentration of the semiconductor at thermal equilibrium. Both p-type and n-type semiconductors are disclosed, with p-types having a larger hole concentration than electron concentration, and n-types having a larger electron concentration than hole concentration.

Silicon carbide (SiC) has excellent physical and electronic properties, which should theoretically allow production of electronic devices that can operate at higher temperatures, higher power, and higher frequency than devices produced from silicon (Si) or gallium arsenide (GaAs) substrates. The high electric breakdown field of about 4×E6 V/cm, high saturated electron drift velocity of about 2.0×E7 cm/sec and high thermal conductivity of about 4.9 W/cm-° K indicate that SiC would be suitable for high frequency and high power applications. In some aspects, the transistor of the disclosure comprises Si, GaAs or other suitable substrates.

GaN HEMTs normally use buffer layers with Fe or other traps to achieve electron confinement for low leakage current needed for good RF performance. However, these traps also have a very slow response time to changing device conditions, and therefore lead to slow transients in the device. These slow transients, also called memory effects, are a serious problem in both commercial and defense applications, and there is a significant effort to minimize these. In this regard, a buried P layer approach to minimize trapping has been utilized while at the same time reducing leakage currents to achieve good device performance. These devices have shown superior trapping performance so far.

The disclosure presents an approach to minimize trapping while maintaining low leakage currents, and good RF performance. This approach is based on using a conductive material, such as Niobium nitride (NbN), which also has a good lattice match to GaN and also to SiC substrates. There has been limited research demonstrating the growth of GaN on NbN. This limited research has also demonstrated HEMTs using this material. However, having a conductive layer, such as NbN, everywhere under the channel of a HEMT device will adversely affect RF performance. The disclosure provides a process of forming the NbN or other conductive layer only in part of the region under the GaN HEMT channel to maintain good RF performance. Several embodiments to achieve this are proposed.

The disclosure further utilizes lattice matched implementations of the conductive material layer to reduce leakage without trapping. The disclosure further utilizes selective formation of the conductive material layer only in part of the region between source and drain to get good RF performance.

The disclosure further provides a process to grow a first GaN buffer layer or the like on SiC substrate. The disclosure further provides a process to form the conductive material layer, such as a NbN layer, selectively in part of the this first buffer layer. The disclosure further provides a process to grow a thin second GaN buffer and an AlGaN and/or GaN HEMT to complete the device structure. Since the second buffer is grown on a previously formed GaN layer of good crystallinity, this layer may be thin. This may provide some advantages in device design.

In one aspect, the disclosure further provides a process to grow the conductive material layer, such as a NbN layer, selectively on a SiC substrate. Thereafter, form a thick GaN buffer layer, followed by forming and AlGaN and/or GaN HEMT structure. Several implementations of the above two processes may be possible.

The disclosed devices may be useful in both commercial and defense applications. In addition, having a highly conductive layer, such as NbN, may also open new possibilities in device design that are not currently available. An example is where the conductive material layer, such as a NbN layer, is used a second gate from the back.

The Figures of the disclosure include a view of a GaN HEMT structure with a patterned NbN buried layer. Additionally, it may be possible to obtain a more planar structure by forming the conductive material layer, such as a NbN layer, inside a hole etched into a first GaN layer. Thereafter, the structure can be planarized.

FIG. 1 shows a cross-sectional view of an aspect of a transistor according to the disclosure.

In particular, FIG. 1 illustrates a transistor 100 that may include any one or more aspects of the disclosure described herein. The transistor 100 may include a substrate layer 102, a buffer layer 104, a barrier layer 108, a conductive material layer 106, and/or the like. In aspects, the transistor 100 may include multiple configurations of the buffer layer 104.

The substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be 1E15/cm$^3$ or less. In one aspect, the substrate layer 102 may be formed of SiC selected from the group of 6H, 4H, 15R, 3C SiC, or the like. In one aspect, the substrate layer 102 may be formed of SiC that may be semi-insulating and doped with vanadium or any other suitable dopant or undoped of high purity with defects providing the semi-insulating properties.

In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials. In particular aspects, the substrate layer 102 may include a planer upper surface that is generally parallel to an X axis as illustrated in FIG. 1 and/or is generally parallel to an Z axis (perpendicular to the X axis and the Y axis). In particular aspects, the substrate layer 102 may include a planer lower surface that is generally parallel to an X axis as illustrated in FIG. 1 and/or is generally parallel to an Z axis (perpendicular to the X axis and the Y axis). Where upper and lower are defined along the Y axis.

The transistor 100 may include a buried conductive material region, a buried conductive portion, a conductive material layer, and/or the like hereinafter the conductive material layer 106. The conductive material layer 106 may be formed within the substrate layer 102. The conductive material layer 106 may be provided solely in the substrate layer 102, extend from the substrate layer 102 to epitaxial layers within the transistor 100, or located solely in one or more of the epitaxial layers of the transistor 100. In aspects, conductive material layer 106 may be formed within the buffer layer 104.

The conductive material layer 106 can span multiple layers and include multiple areas of different or graded conductive material. In accordance with other aspects of the disclosure, the conductive material layer 106 may also be formed below the barrier layer 108 between the barrier layer 108 and the substrate layer 102 and/or within the substrate layer 102. In some aspects, the conductive material layer 106 may have sublayers, the conductive material layer 106 may have sublayers of different materials as described herein, the conductive material layer 106 may have sublayers having other intervening layers therebetween, and/or the like. In some aspects, the conductive material layer 106 may have multiple layers, the conductive material layer 106 may have multiple layers of different materials as described herein, the conductive material layer 106 may have multiple layers having other intervening layers therebetween, and/or the like.

In one or more aspects, the conductive material layer 106 may be a conductive material, a metal material, a superconducting material, a conductive layer, a metal layer, a superconducting layer, a conductive portion, a metal portion, a superconducting portion, a metallic material, a metallic layer, a metallic portion, and/or the like. In one or more aspects, the conductive material layer 106 may have a good lattice match to one or more layers of the transistor 100. In one or more aspects, the conductive material layer 106 may have a good lattice match to the buffer layer 104 and/or the substrate layer 102. In one or more aspects, the conductive material layer 106 may have a good lattice match to GaN layers of the transistor 100 and/or of the substrate layer 102. In one or more aspects, the conductive material layer 106 may have a good lattice match to GaN layers of the transistor 100 and/or also to SiC implementations of the substrate layer 102.

However, having the conductive material layer 106 everywhere under the channel of the transistor 100 may adversely affect RF performance of the transistor 100. Accordingly, the disclosure in aspects forms the conductive material layer 106 only in part of the region under the GaN HEMT channel of the transistor 100 to maintain good RF performance.

The conductive material layer 106 may be configured to be lattice matched with other layers of the transistor 100, such as the substrate layer 102, the buffer layer 104, the barrier layer 108, and/or the like. In this regard, the conductive material layer 106 may be configured to be lattice matched with other layers of the transistor 100 and may reduce leakage without trapping. In one or more aspects, the conductive material layer 106 may be formed only in part of the region between the source 110 and the drain 112 to achieve good RF performance.

In one aspect, the conductive material layer 106 may be grown selectively on the buffer layer 104. In one aspect, the conductive material layer 106 may be a conductive material, a metal material, a superconducting material, and/or the like that may be grown selectively on the buffer layer 104. In one aspect, the conductive material layer 106 may be a conductive material, a metal material, a superconducting material, a metallic material, a metallic layer, a metallic portion, and/or the like that may be grown selectively the buffer layer 104.

In one aspect, the conductive material layer 106 may be grown selectively on the substrate layer 102. In one aspect, the conductive material layer 106 may be grown selectively on a SiC implementation of the substrate layer 102. In one aspect, the conductive material layer 106 may be a conductive material, a metallic material, a superconducting material, and/or the like that may be grown selectively on the substrate layer 102. In one aspect, the conductive material layer 106 may be a conductive material, a metallic material, a superconducting material, a metallic material, a metallic layer, a metallic portion, and/or the like that may be grown selectively on a SiC implementation of the substrate layer 102.

In one aspect, the conductive material layer 106 may be NbN that may be grown selectively on the substrate layer 102 and/or the buffer layer 104. In one aspect, the conductive material layer 106 may be NbN that may be grown selectively on a SiC implementation of the substrate layer 102 and/or the buffer layer 104.

In one aspect, the conductive material layer 106 may be patterned selectively on the substrate layer 102 and/or the buffer layer 104. In one aspect, the conductive material layer 106 may be patterned selectively on a SiC implementation of the substrate layer 102 and/or the buffer layer 104.

In one aspect, the conductive material layer 106 may be a patterned NbN layer. In one aspect, the conductive material layer 106 may be a patterned NbN buried layer.

In one aspect, one or more layers of the transistor 100 may be masked and the conductive material layer 106 grown on the substrate layer 102 and/or the buffer layer 104. In one aspect, the conductive material layer 106 may be grown on the substrate layer 102 and/or the buffer layer 104 and then etched.

In one aspect, the conductive material layer 106 may be NbN formed inside a hole etched into a layer of the transistor 100 such as the buffer layer 104, a first GaN layer, and/or the like. Thereafter, the conductive material layer 106 may be planarized.

In one aspect, the conductive material layer 106 may be an epitaxial integration of the semiconducting and superconducting nitride lattice constants of Nb-based nitride metals such as hexagonal $Nb_2N$, hexagonal NbN, cubic NbN, and/or the like that may be close to the lattice constants of one or more of the layers of the transistor 100, such as the substrate layer 102, the buffer layer 104, the barrier layer 108, and/or the like.

In one aspect, the conductive material layer 106 may be implemented by epitaxial metal NbN layers. In one aspect, the conductive material layer 106 may be implemented by growing crystalline epitaxial metal NbN layers on the substrate layer 102 and/or the buffer layer 104.

In one aspect, the conductive material layer 106 may be implemented by growing crystalline epitaxial metal NbN layers by molecular beam epitaxy on the substrate layer 102 and/or the buffer layer 104. In one aspect, the epitaxial layers of NbN implementation of the conductive material layer 106 may exhibit superconductivity.

In one aspect, the conductive material layer 106 may be implemented by growing NbN deposited by electron-beam evaporation or sputtering on the substrate layer 102 and/or the buffer layer 104. In one aspect, the conductive material layer 106 may be implemented by growing NbN utilizing a radio-frequency plasma nitrogen source and lasers to provide the active nitrogen atoms. In one aspect, the conductive material layer 106 may be implemented by growing NbN utilizing an electron-beam source of niobium on the substrate layer 102 and/or the buffer layer 104. In one aspect, the conductive material layer 106 may be implemented by growing NbN on the substrate layer 102 and/or the buffer layer 104 and may include capping with a layer such as an AlN layer.

In one aspect, the conductive material layer 106 may be a deep layer. In one aspect, the conductive material layer 106 may have a thickness of 1 µm or less, 0.7 µm or less, 0.5 µm or less, 0.3 µm to 0.5 µm, 0.2 µm to 0.6 µm, 0.4 µm to 0.6 µm, 0.6 µm to 0.8 µm, 0.6 µm to 1.6 µm, 0.6 µm to 2.1 µm, 1 µm to 5 µm. In one aspect, the conductive material layer 106 may have a thickness of 0.5% to 0.3% of a thickness of the substrate layer 102, a thickness of 0.5% to 0.1% of a thickness of the substrate layer 102, 0.1% to 0.15% of a thickness of the substrate layer 102, 0.15% to 0.2% of a thickness of the substrate layer 102, 0.2% to 0.25% of a thickness of the substrate layer 102, a thickness of 0.25% to 0.3% of a thickness of the substrate layer 102.

In aspects of the transistor 100 of the disclosure, the conductive material layer 106 may be neutralized to limit the length of the conductive material layer 106. Another way to limit the length of the conductive material layer 106 may be to etch the conductive material layer 106. In aspects of the transistor 100 of the disclosure, the conductive material layer 106 may be formed by growing the conductive material layer 106 on the substrate layer 102 and/or the buffer layer 104. Growth may be epitaxial, for example. To limit the length of the conductive material layer 106, the conductive material layer 106 may be etched or otherwise neutralized. In aspects of the transistor 100 of the disclosure, the substrate layer 102 may be etched and the conductive material layer 106 may be formed by growing the conductive material layer 106 on the substrate layer 102 and/or the buffer layer 104. In one aspect, the growth may be epitaxial.

In some aspects, the conductive material layer 106 may be an epitaxial layer. In aspects of the transistor 100 of the disclosure, the substrate layer 102 may be etched and the conductive material layer 106 may be formed by growing the conductive material layer 106. In one aspect, the growth may be epitaxial.

In some aspects, the conductive material layer 106 may be under 0.6 μm in thickness. In some aspects, the conductive material layer 106 may be under 0.5 μm in thickness. In some aspects, the conductive material layer 106 may be under 0.4 μm in thickness. In some aspects, the conductive material layer 106 may be under 0.3 μm in thickness. In some aspects, the conductive material layer 106 may be under 0.2 μm in thickness. In some aspects, the conductive material layer 106 may be between 0.1 and 0.6 μm in thickness. In some aspects, the conductive material layer 106 may be between 0.5 and 0.6 μm in thickness. In some aspects, the conductive material layer 106 may be between 0.4 and 0.5 μm in thickness. In some aspects, the conductive material layer 106 may be between 0.3 and 0.4 μm in thickness. In some aspects, the conductive material layer 106 may be between 0.2 and 0.3 μm in thickness. In some aspects, the conductive material layer 106 may be between 0.1 and 0.3 μm in thickness. In some aspects, the conductive material layer 106 may be between 0.5 and 0.25 μm in thickness. In some aspects, the conductive material layer 106 may be between 0.15 and 0.25 μm in thickness.

In particular aspects, the conductive material layer 106 may include a planer upper surface that is generally parallel to an X axis as illustrated in FIG. 1 and/or is generally parallel to an Z axis (perpendicular to the X axis and the Y axis). In particular aspects, the conductive material layer 106 may include a planar lower surface that is generally parallel to an X axis as illustrated in FIG. 1 and/or is generally parallel to an Z axis (perpendicular to the X axis and the Y axis). Where upper and lower are defined along the Y axis. Depending on the material of the substrate layer 102, a nucleation layer 136 may be formed on the substrate layer 102 to reduce a lattice mismatch between the substrate layer 102 and a next layer in the transistor 100. In one aspect, the nucleation layer 136 may be formed directly on the substrate layer 102. In other aspects, the nucleation layer 136 may be formed on the substrate layer 102 with intervening layer(s), such as SiC epitaxial layer(s) formed on a SiC implementation of the substrate layer 102. The nucleation layer 136 may include different suitable materials, such as a Group III-Nitride material, e.g., $Al_xIn_{y1-x-y}GaN$ (where $0<=x<=1$, $0<=y<=1$, $x+y<=1$). The nucleation layer 136 may be formed on the substrate layer 102 using known semiconductor growth techniques such as Metal Oxide Chemical Vapor Deposition (MOCVD), Hydride Vapor Phase Epitaxy (HVPE), Molecular Beam Epitaxy (MBE), or the like. In some aspects, the nucleation layer is Aluminum Nitride (AlN) or Aluminum Gallium Nitride (AlGaN), such as undoped AlN or AlGaN.

In some aspects, the buffer layer 104 may be formed on the substrate layer 102, the conductive material layer 106 may be formed within a first configuration of the buffer layer 104, a second configuration of the buffer layer 104 may be formed on the first configuration of the buffer layer 104, and the barrier layer 108 may be formed on the second configuration of the buffer layer 104. In this regard, since the second configuration of the buffer layer 104 is grown on a previously formed first configuration of the buffer layer 104 of good crystallinity, the second configuration of the buffer layer 104 may be thin. This may provide some advantages in device design.

In some aspects, the buffer layer 104 may be formed on the substrate layer 102, the conductive material layer 106 may be formed within the buffer layer 104, and the barrier layer 108 may be formed on the buffer layer 104.

In some aspects, the buffer layer 104 may be formed directly on the nucleation layer 136 or on the nucleation layer 136 with intervening layer(s). Depending on the aspect, the buffer layer 104 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. In one aspect, the buffer layer 104 is formed of GaN. The buffer layer 104 or portions thereof may be doped with dopants, such as, Fe and/or C or alternatively can be wholly or partly undoped. In one aspect, the buffer layer 104 is directly on the substrate layer 102. In particular aspects, the buffer layer 104 may include a planar upper surface that is generally parallel to an X axis as illustrated in FIG. 1 and/or is generally parallel to an Z axis (perpendicular to the X axis and the Y axis). In particular aspects, the buffer layer 104 may include a planer lower surface that is generally parallel to an X axis as illustrated in FIG. 1 and/or is generally parallel to an Z axis (perpendicular to the X axis and the Y axis). Where upper and lower are defined along the Y axis.

In one aspect, the buffer layer 104 may include an upper portion of high purity GaN and the buffer layer 104 may also include a lower portion that may form an AlGaN back barrier to achieve better electron confinement. In one aspect, the lower portion that forms the back barrier may be AlGaN of n type. The back barrier construction may be implemented in any of the aspects of the disclosure.

In one aspect, the buffer layer 104 may be high purity GaN. In one aspect, the buffer layer 104 may be high purity GaN that may be a low-doped n-type. In one aspect, the buffer layer 104 may also use a higher band gap Group III-nitride layer as a back barrier, such as an AlGaN back barrier, on the other side of the buffer layer 104 from a barrier layer 108 to achieve better electron confinement.

In one aspect, the buffer layer 104 may be a thick layer. In particular, if the conductive material layer 106 is formed on the substrate layer 102 then a single thick configuration of the buffer layer 104 may be formed on the conductive material layer 106.

In one aspect, the buffer layer 104 may have a buffer layer thickness defined as a distance between an upper surface of the substrate layer 102 and a lower surface of the barrier layer 108. In one aspect, the buffer layer thickness may be less than 0.8 microns, less than 0.7 microns, less than 0.6 microns, less than 0.5 microns, or less than 0.4 microns. In one aspect, the buffer layer thickness may have a range of 0.8 microns to 0.6 microns, 0.7 microns to 0.5 microns, 0.6 microns to 0.4 microns, 0.5 microns to 0.3 microns, 0.4 microns to 0.2 microns, or 0.7 microns to 0.3 microns.

In one aspect, the transistor 100 may have an intervening layer(s) thickness defined as a length between an upper surface of the substrate layer 102 and a lower surface of the barrier layer 108. In one aspect, the intervening layer(s) thickness may be less than 0.8 microns, less than 0.7 microns, less than 0.6 microns, less than 0.5 microns, or less than 0.4 microns. In one aspect, the intervening layer(s) thickness may have a range of 0.8 microns to 0.6 microns, 0.7 microns to 0.5 microns, 0.6 microns to 0.4 microns, 0.5 microns to 0.3 microns, or 0.4 microns to 0.2 microns.

The barrier layer 108 may be formed on the buffer layer 104. In one aspect, the barrier layer 108 may be formed directly on the buffer layer 104, and in other aspects, the barrier layer 108 is formed on the buffer layer 104 with intervening layer(s). Depending on the aspect, the buffer layer 104 may be formed of different suitable materials such as a Group III-nitride such as $Al_xGa_yIn_{(1-x-y)}N$ (where $0<=x<=1$, $0<=y<=1$, $x+y<=1$), e.g., AlGaN, AlN, or InAlGaN, or another suitable material. In one aspect, the barrier layer 108 may be AlGaN, and in another aspect the barrier layer 108 is AlN. In one aspect, the barrier layer 108 may be undoped. In one aspect, the barrier layer 108 may be doped. In one aspect, the barrier layer 108 may be an n-type material. In some aspects, the barrier layer 108 may have multiple layers of n-type material having different carrier concentrations. In one aspect, the barrier layer 108 may be a Group III-nitride or a combination thereof. In particular aspects, the barrier layer 108 may include a planer upper surface that is generally parallel to an X axis as illustrated in FIG. 1 and/or is generally parallel to an Z axis (perpendicular to the X axis and the Y axis). In particular aspects, the barrier layer 108 may include a planer lower surface that is generally parallel to an X axis as illustrated in FIG. 1 and/or is generally parallel to an Z axis (perpendicular to the X axis and the Y axis). Where upper and lower are defined along the Y axis.

In one aspect, a bandgap of the buffer layer 104 may be less than a bandgap of the barrier layer 108 to form a two-dimensional electron gas (2DEG) at a heterointerface 152 between the buffer layer 104 and barrier layer 108 when biased at an appropriate level. In one aspect, a bandgap of the buffer layer 104 that may be GaN may be less than a bandgap of the barrier layer 108 that may be AlGaN to form the two-dimensional electron gas (2DEG) at a heterointerface 152 between the buffer layer 104 and barrier layer 108 when biased at an appropriate level.

In aspects of the disclosure, the heterointerface 152 may be between the barrier layer 108 and the buffer layer 104. In one aspect, the source 110 and the drain 112 electrodes may be formed making ohmic contacts such that an electric current flows between the source 110 and the drain 112 electrodes via a two-dimensional electron gas (2DEG) induced at the heterointerface 152 between the buffer layer 104 and barrier layer 108 when the gate 114 electrode is biased at an appropriate level.

In one aspect, the source 110, the drain 112 and the gate 114 may be formed on the barrier layer 108. The source 110, the drain 112, and/or the gate 114 may be arranged directly on the barrier layer 108 or may be on intervening layer(s) on the barrier layer 108, such as an AlGaN layer on an AlN barrier layer. Other or additional intervening layers are possible. For example, a spacer layer 116 of SiN, AlO, SiO, $SiO_2$, AlN, or the like or combinations thereof can be provided on the barrier layer 108 or other intervening layers. In one aspect, the barrier layer 108 may include a region 164 under the source 110 and/or the drain 112 that is a N+ material. In one aspect, the barrier layer 108 may include a region 164 under the source 110 and/or drain 112 that is Si doped. In one aspect, the n-type dopants in the region 164 are implanted.

In one aspect, the source 110, the drain 112 and the gate 114 may be formed on the buffer layer 104. The source 110, the drain 112, and/or the gate 114 may be arranged directly on the buffer layer 104 or may be on intervening layer(s) on the buffer layer 104, such as an AlGaN layer on an AlN barrier layer. In one aspect, the buffer layer 104 may include a region 164 under the source 110 and/or the drain 112 that is a N+ material. In one aspect, the buffer layer 104 may include a region 164 under the source 110 and/or drain 112 that is Si doped. In one aspect, the n-type dopants in the region 164 are implanted.

In some aspects, the source 110 and the drain 112 may be symmetrical with respect to the gate 114. In some switch device application aspects, the source 110 and the drain 112 may be symmetrical with respect to the gate 114. In some aspects, the source 110 and the drain 112 may be asymmetrical with respect to the gate 114. In one aspect, the gate 114 may be a T-shaped gate. In one aspect, the gate 114 may be a non-T shaped gate.

To protect and separate the gate 114 and the drain 112, a spacer layer 116 may be arranged on the barrier layer 108, on a side opposite the buffer layer 104, adjacent the gate 114, the drain 112 and the source 110. The spacer layer 116 may be a passivation layer made of SiN, AlO, SiO, $SiO_2$, AlN, or the like, or a combination incorporating multiple layers thereof. In one aspect, the spacer layer 116 is a passivation layer made of SiN. In one aspect, the spacer layer 116 can be deposited using MOCVD, plasma chemical vapor deposition (CVD), hot-filament CVD, or sputtering. In one aspect, the spacer layer 116 may include deposition of $Si_3N_4$. In one aspect, the spacer layer 116 forms an insulating layer. In one aspect, the spacer layer 116 forms an insulator. In one aspect, the spacer layer 116 may be a dielectric. In one aspect, a spacer layer 116 may be provided on the barrier layer 108. In one aspect, the spacer layer 116 may include non-conducting material such as a dielectric. In one aspect, the spacer layer 116 may include a number of different layers of dielectrics or a combination of dielectric layers. In one aspect, the spacer layer 116 may be many different thicknesses, with a suitable range of thicknesses being approximately 0.5 to 2 microns. In one aspect, the spacer layer 116 may include a material such as a Group III nitride material having different Group III elements such as alloys of Al, Ga, or In, with a suitable spacer layer material being $Al_xIn_yGa_{1-x-y}$ (where $0<=x<=1$ and $0<=y<=1$, $x+y<=1$).

In some aspects, the gate 114 may be deposited in a channel formed in the spacer layer 116, and a T-gate may be formed using semiconductor processing techniques understood by those of ordinary skill in the art. Other gate configurations are possible.

In aspects of the transistor 100 of the disclosure, the substrate layer 102 may be silicon carbide and include a carbon face. In one aspect, the substrate layer 102 may be silicon carbide and include a carbon face arranged adjacent the buffer layer 104. In one aspect, the substrate layer 102 may be silicon carbide and include a carbon face and the substrate layer 102 may be flipped so as to be arranged adjacent the buffer layer 104. In this aspect, the buffer layer 104 may be GaN having a nitrogen face adjacent the carbon face of the substrate layer 102. In one aspect, the buffer layer 104 may be GaN having alternating GaN and N layers with a N layer and/or a nitrogen face adjacent the carbon face of the substrate layer 102.

In aspects of the transistor 100 of the disclosure, the buffer layer 104 may include nonpolar GaN. In one aspect, the buffer layer 104 may include semipolar GaN. In one aspect, the buffer layer 104 may include hot wall epitaxy. In one aspect, the buffer layer 104 may include hot wall epitaxy having a thickness in the range of 0.15 microns to 0.25 microns, 0.2 microns to 0.3 microns, 0.25 microns to 0.35 microns, 0.3 microns to 0.35 microns, 0.35 microns to 0.4 microns, 0.4 microns to 0.45 microns, 0.45 microns to 0.5 microns, 0.5 microns to 0.55 microns, or 0.15 microns to 0.55 microns. The conductive material layer 106 may help avoid breakdowns and problems with material impurities. For example, without a conductive material layer 106, the transistor 100 may need impurities, which do not discharge well. The conductive material layer 106 may be formed beneath the gate 114, and may extend toward the source 110 and the drain 112 of the device.

In aspects of the transistor 100 of the disclosure, the buffer layer 104 may be designed to be of the high purity type where the Fermi level is in the upper half of the bandgap, which reduces slow trapping effects normally observed in GaN HEMTs. In this regard, the traps under the Fermi level are filled always and thus slow transients may be prevented. In some aspects, the buffer layer 104 may be as thin as possible consistent with achieving good crystalline quality. Applicants have already demonstrated 0.4 µm layers with good quality.

In aspects of the transistor 100 of the disclosure, a $Al_xIn_yGa_{1-x-y}$ (where $0<=x<=1$ and $0<=y<=1$, $x+y<=1$) nucleation layer 136 or buffer layer 104 may be grown on the substrate layer 102 via an epitaxial crystal growth method, such as MOCVD (Metalorganic Chemical Vapor Deposition), HVPE (Hydride Vapor Phase Epitaxy) or MBE (Molecular Beam Epitaxy). The formation of the nucleation layer 136 may depend on the material of the substrate layer 102.

In aspects of the transistor 100 of the disclosure, the buffer layer 104 may be formed with Lateral Epitaxial Overgrowth (LEO). LEO can, for example, improve the crystalline quality of GaN layers. When semiconductor layers of a HEMT are epitaxial, the layer upon which each epitaxial layer is grown may affect the characteristics of the device. For example, LEO may reduce dislocation density in epitaxial GaN layers.

Figure 6:
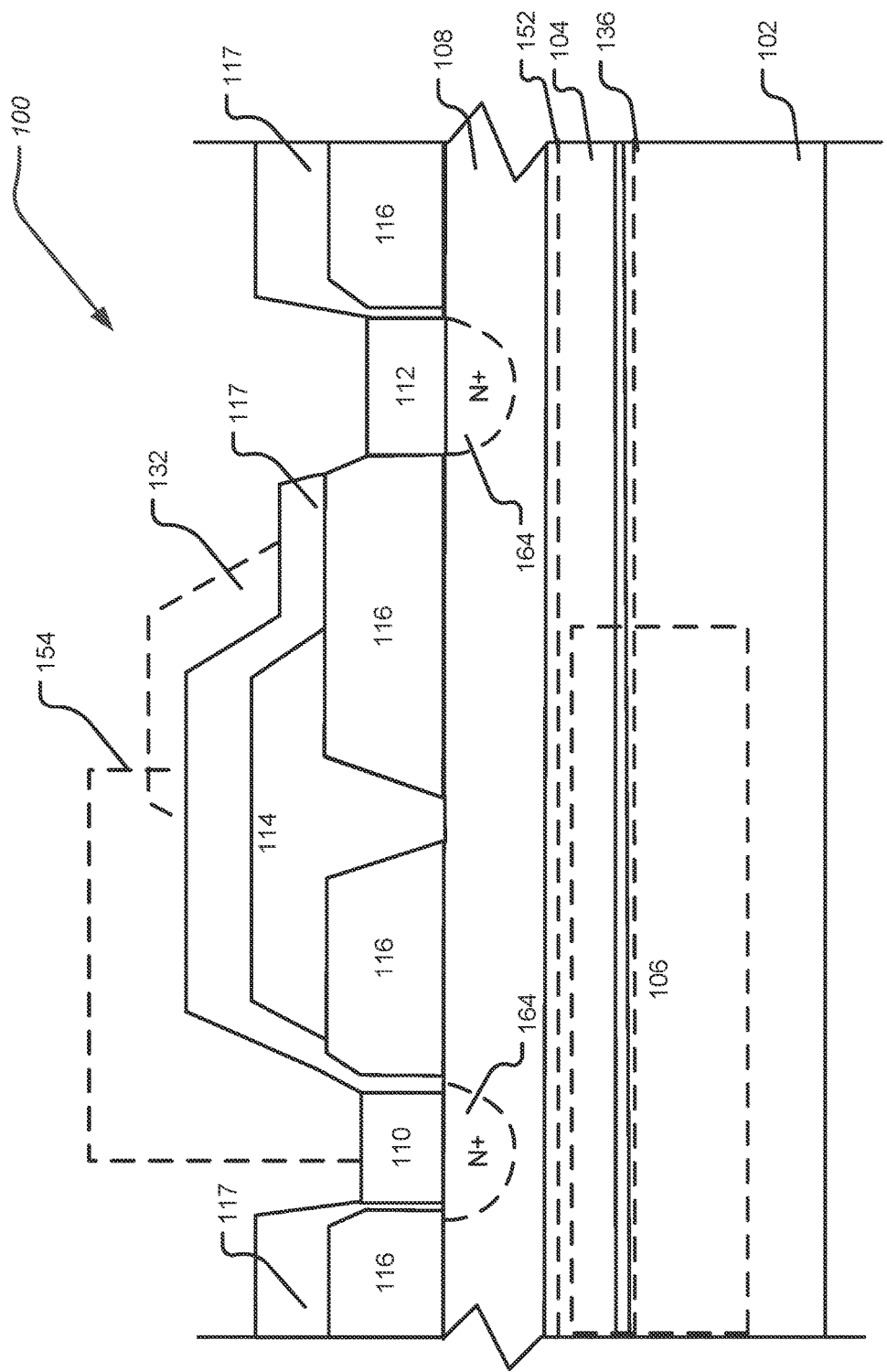
FIG. 6 shows a cross-sectional view of another aspect of a transistor according to the disclosure.

With reference to the description of FIG. 6, the transistor 100 may include a second spacer layer 117 that may be formed on the spacer layer 116 and the gate 114. With reference to the description of FIG. 7, the transistor 100 may include a field plate 132. With reference to the description of FIG. 8, the transistor 100 may include a connection 154 to the field plate 132.

Figure 2:
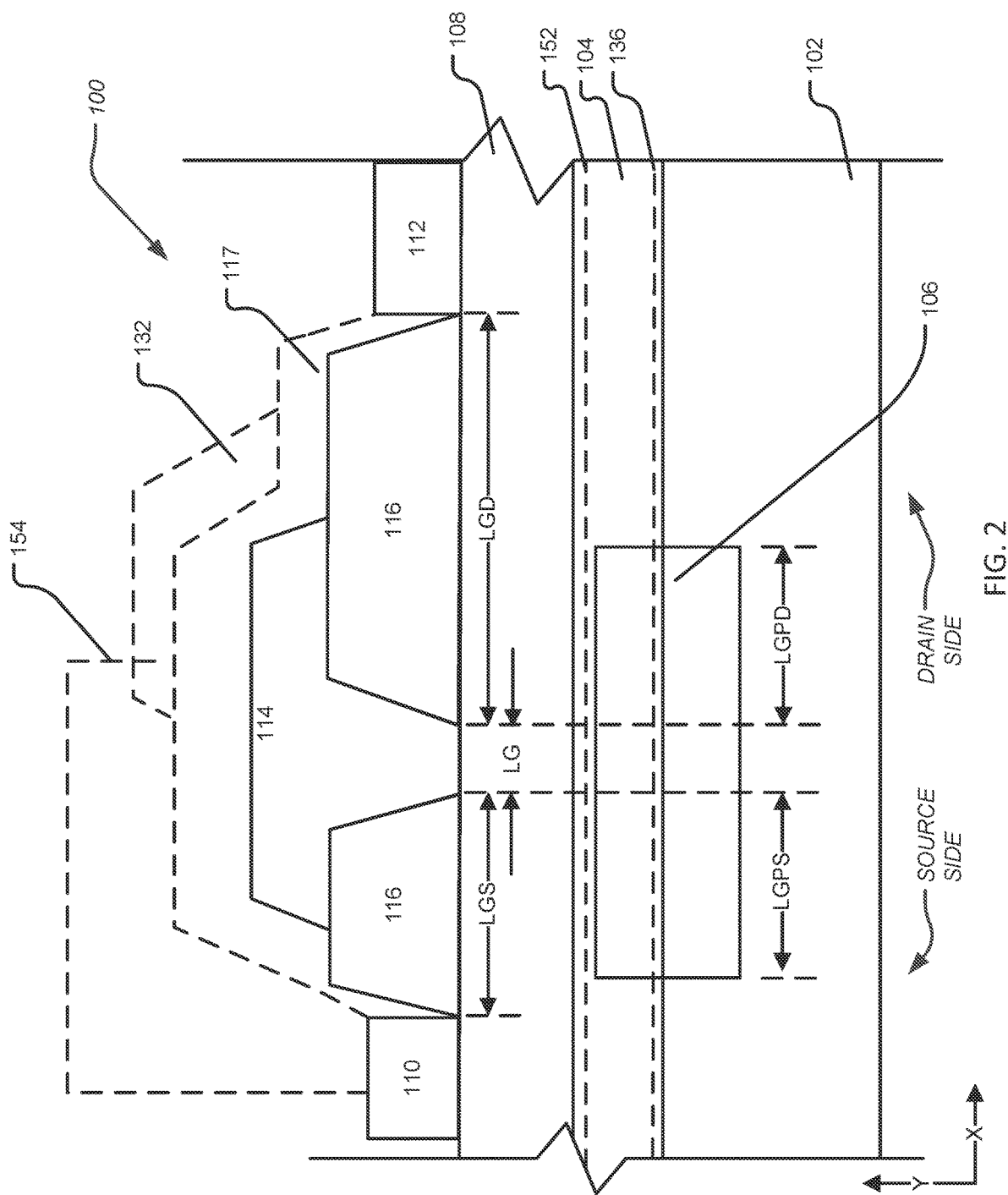
FIG. 2 shows a cross-sectional view of an aspect of the transistor according to FIG. 1.

FIG. 2 shows a cross-sectional view of an aspect of the transistor according to FIG. 1.

In particular, FIG. 2 illustrates a transistor 100 that may include any one or more aspects of the disclosure described herein. In one aspect of the disclosure, the conductive material layer 106 may not extend over the entire area of the transistor 100. In this regard, the conductive material layer 106 may be selectively arranged as described herein, the conductive material layer 106 may be arranged over the entire length and selectively removed as described herein, the conductive material layer 106 may be arranged over the entire length and selectively electrically neutralized as described herein, or the like. Accordingly, the specific constructions of the conductive material layer 106 described below encompass any of these processes that result in the conductive material layer 106 having an operating construction and arrangement as noted below. In other words, the length and/or size of the conductive material layer 106 does not include a part that is partially electrically neutralized, partially etched, or the like. The length and/or size of the conductive material layer 106 may depend on the application of the transistor 100, requirements for the transistor 100, and the like. Limiting a length of the conductive material layer 106 reduces lag effect, avoids adverse effects on RF performance for certain transistor applications, and/or the like.

As shown in FIG. 2, the conductive material layer 106 may be present in limited areas as described in further detail below. In some aspects, the conductive material layer 106 may be present in a gate-source region. In some aspects, the conductive material layer 106 may be present in a gate-source region and also partly under the gate 114. In some aspects, the conductive material layer 106 may be arranged at least partially under the gate 114 and/or the source 110. In some aspects, the conductive material layer 106 may be arranged at least partially under the gate 114 and/or and not arranged under the source 110.

In one aspect, the conductive material layer 106 may be arranged at least partially vertically under the gate 114 along the y-axis and may extend along the x-axis partially toward the source 110 and the drain 112. In this aspect, no portion of the conductive material layer 106 may be located vertically along the y-axis below the source 110; and no portion of the conductive material layer 106 may be located vertically along the y-axis below the source 110. In this aspect, a portion of the substrate layer 102 may be free of the conductive material layer 106 on a source side of the transistor 100; and a portion of the substrate layer 102 may be free of the conductive material layer 106 on a drain side of the transistor 100. In this regard, a source side of the transistor 100 is defined as a side of the transistor 100 extending from the gate 114 toward and past the source 110 as illustrated in FIG. 2; and a drain side of the transistor 100 is defined as a side of the transistor 100 extending from the gate 114 toward and past the drain 112 as illustrated in FIG. 2.

In one aspect, the conductive material layer 106 may be arranged at least partially vertically under the gate 114 along the y-axis and may extend along the x-axis partially toward the source 110 and the drain 112. In this aspect, only a portion of the conductive material layer 106 may be located vertically along the y-axis below the source 110; and no portion of the conductive material layer 106 may be located vertically along the y-axis below the source 110. In this aspect, a portion of the substrate layer 102 may not include the conductive material layer 106 located vertically along the y-axis below the source 110. In this aspect, a portion of the substrate layer 102 may be free of the conductive material layer 106 on a source side of the transistor 100; and a portion of the substrate layer 102 may be free of the conductive material layer 106 on a drain side of the transistor 100.

In one aspect, the conductive material layer 106 may be arranged at least partially vertically under the gate 114 along the y-axis and may extend along the x-axis partially toward the source 110 and the drain 112. In this aspect, a portion of the conductive material layer 106 may be located vertically along the y-axis entirely below the source 110; and no portion of the conductive material layer 106 may be located vertically along the y-axis below the drain 112. In this aspect, a portion of the substrate layer 102 may not include the conductive material layer 106 located vertically along the y-axis past the source 110. In this aspect, a portion of the substrate layer 102 may be free of the conductive material layer 106 on a source side of the transistor 100; and a portion of the substrate layer 102 may be free of the conductive material layer 106 on a drain side of the transistor 100.

In one aspect, the conductive material layer 106 may be arranged vertically under the gate 114 along the y-axis and may extend along the x-axis partially toward the source 110 and the drain 112. In this aspect, a portion of the conductive material layer 106 may be located vertically along the y-axis entirely below the source 110; and no portion of the conductive material layer 106 may be located vertically along the y-axis below the source 110. In this aspect, a portion of the substrate layer 102 may not include the conductive material layer 106 located vertically along the y-axis past the source 110. In this aspect, a portion of the substrate layer 102 may be free of the conductive material layer 106 on a source side of the transistor 100; and a portion of the substrate layer 102 may be free of the conductive material layer 106 on a drain side of the transistor 100.

With reference to FIG. 2, various dimensions of components of the transistor 100 will be described in order to define dimensions of the conductive material layer 106. The gate 114 may have a width LG along a lower surface of the gate 114 that is adjacent the barrier layer 108 that is parallel to the X axis. In particular, the width LG may extend from one lower corner of the gate 114 to the other lower corner of the gate 114. The definition of the width LG is illustrated in FIG. 2. In some aspects, the width LG may be between 0.5 µm and 0.6 µm, 0.5 µm and 0.6 µm, 0.4 µm and 0.5 µm, 0.3 µm and 0.4 µm, 0.2 µm and 0.3 µm, 0.1 µm and 0.2 µm, or 0.1 µm and 0.5 µm in length along the x-axis. In some aspects, a width of the gate 114 above a lower surface may be greater than the width LG as illustrated in FIG. 2.

The distance from the gate 114 to the source 110 may be defined as distance LGS. In particular, the distance LGS may be defined as a distance from a lower corner of the gate 114 on a source side to a lower corner of the source 110 on a gate side. The definition of the distance LGS is illustrated in FIG. 2.

The distance from the gate 114 to the drain 112 may be defined as the distance LGD. In particular, the distance LGD may be defined as a distance from a lower corner of the gate 114 on a drain side to a lower corner of the drain 112 on a gate side. The definition of the distance LGD is illustrated in FIG. 2.

In one aspect, the conductive material layer 106 may extend laterally along the x-axis from at least beneath the lower corner of the gate 114 on a source side toward the source 110 a distance LGPS. The definition of the distance LGPS is illustrated in FIG. 2. In some aspects, the distance LGPS may be between 1 µm and 6 µm, 5 µm and 6 µm, 4 µm and 5 µm, 3 µm and 4 µm, 2 µm and 3 µm, or 1 µm and 3 µm in length along the x-axis.

In one aspect, the conductive material layer 106 may extend laterally along the x-axis from at least beneath the lower corner of the gate 114 on a drain side toward the drain 112 a distance LGPD. In some aspects, the distance LGPD may be between 0.1 µm and 0.6 µm, 0.5 µm and 0.6 µm, 0.4 µm and 0.5 µm, 0.3 µm and 0.4 µm, 0.2 µm and 0.3 µm, or 0.1 µm and 0.3 µm in length along the x-axis.

Accordingly, a length of the conductive material layer 106 may be a sum of the distance LGPD, the width LG, and the distance LGPS. In this regard, a length of the conductive material layer 106 reduces lag effect, avoids adverse effects on RF performance for certain transistor applications, and/or the like.

In one aspect, the length LGPS may be 100% to 700% of LG, 100% to 200% of LG, 200% to 300% of LG, 300% to 400% of LG, 400% to 500% of LG, 500% to 600% of LG, or 600% to 700% of LG.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one aspect, the length LGS may be 10% to 180% of LGPS, 10% to 20% of LGPS, 20% to 30% of LGPS, 30% to 40% of LGPS, 40% to 50% of LGPS, 50% to 60% of LGPS, 60% to 70% of LGPS, 70% to 80% of LGPS, 80% to 90% of LGPS, 90% to 100% of LGPS, 100% to 110% of LGPS, 110% to 120% of LGPS, 110% to 130% of LGPS, 130% to 140% of LGPS, 140% to 150% of LGPS, 150% to 160% of LGPS, 160% to 170% of LGPS, or 170% to 180% of LGPS.

In one aspect, the length LG may be 10% to 180% of LGPD, 10% to 20% of LGPD, 20% to 30% of LGPD, 30% to 40% of LGPD, 40% to 50% of LGPD, 50% to 60% of LGPD, 60% to 70% of LGPD, 70% to 80% of LGPD, 80% to 90% of LGPD, 90% to 100% of LGPD, 100% to 110% of LGPD, 110% to 120% of LGPD, 110% to 130% of LGPD, 130% to 140% of LGPD, 140% to 150% of LGPD, 150% to 160% of LGPD, 160% to 170% of LGPD, or 170% to 180% of LGPD.

In one or more aspects, a part of a source side of the substrate layer 102 may be free of the conductive material layer 106. In one or more aspects, a part of a drain side of the substrate layer 102 may be free of the conductive material layer 106. In one or more aspects, a part of a source side of the substrate layer 102 may be free of the conductive material layer 106 and a part of a drain side of the substrate layer 102 may be free of the conductive material layer 106.

In one or more aspects, the conductive material layer 106 may be arranged under and across a length of the gate 114 and may extend toward the source 110 and the drain 112.

In one or more aspects, a distance LGD may be a distance from a lower corner of the gate 114 on the drain 112 side to a lower corner of the drain 112 on a gate side; a distance LGS may be a distance from a lower corner of the gate 114 on the source 110 side to a lower corner of the source 110 on a gate side; and the distance LGD may be greater than the distance LGS. In one or more aspects, a distance LGPS may define a length of a portion of the conductive material layer 106 from a lower corner of the gate 114 on the source 110 side toward the source 110; a distance LGPD may define a length of a portion of the conductive material layer 106 from a lower corner of the gate 114 on the drain 112 side toward the drain 112; and the distance LGPS may be equal to the distance LGPD. In one or more aspects, a distance LGPS may define a length of a portion of the conductive material layer 106 from a lower corner of the gate 114 on the source 110 side toward the source 110; a distance LGPD may define a length of a portion of the conductive material layer 106 from a lower corner of the gate 114 on the drain 112 side toward the drain 112; and the distance LGPS may be greater than the distance LGPD. In one or more aspects, a distance LGPS may define a length of a portion of the conductive material layer 106 from a lower corner of the gate 114 on the source 110 side toward the source 110; a distance LGPD may define a length of a portion of the conductive material layer 106 from a lower corner of the gate 114 on the drain 112 side toward the drain 112; and the distance LGPD may be greater than the distance LGPS.

In one or more aspects, the conductive material layer 106 may extend toward the source 110 but does not vertically overlap the source 110. In one or more aspects, the conductive material layer 106 may vertically overlap the source 110. In one or more aspects, the conductive material layer 106 may extend toward the drain 112 but does not vertically overlap the drain 112. In one or more aspects, the conductive material layer 106 may vertically overlap the drain 112. In one or more aspects, the conductive material layer 106 may be electrically connected to the gate 114. In one or more aspects, the gate 114 may be electrically connected to any external circuit or voltage. In one or more aspects, the conductive material layer 106 may have no direct electrical connections. In one or more aspects, the conductive material layer 106 may be electrically connected to the source 110.

In some aspects, part of the voltage from a drain 112 to a source 110 may be dropped in the conductive material layer 106 region. This may also deplete the channel in the lateral direction. The lateral depletion may reduce the lateral field and increase breakdown voltage. Alternatively, a more compact structure can be obtained for a required breakdown voltage. The conductive material layer 106 may eliminate the need to have C or Fe doping of the buffer needed to sustain the applied drain voltage. Elimination of C and Fe leads to decreased current reduction under operating conditions (no trapping). Moreover, in some aspects the conductive material layer 106 may support the field.

In some aspects, the conductive material layer 106 may also be configured to have a varying material profile perpendicular to the surface. In some aspects, the conductive material layer 106 may also be configured to have a varying profile perpendicular to the surface extending into the cross-sectional views of the Figures. The profile may be configured to achieve desired breakdown voltage, device size, switching time, and the like.

Figure 3:
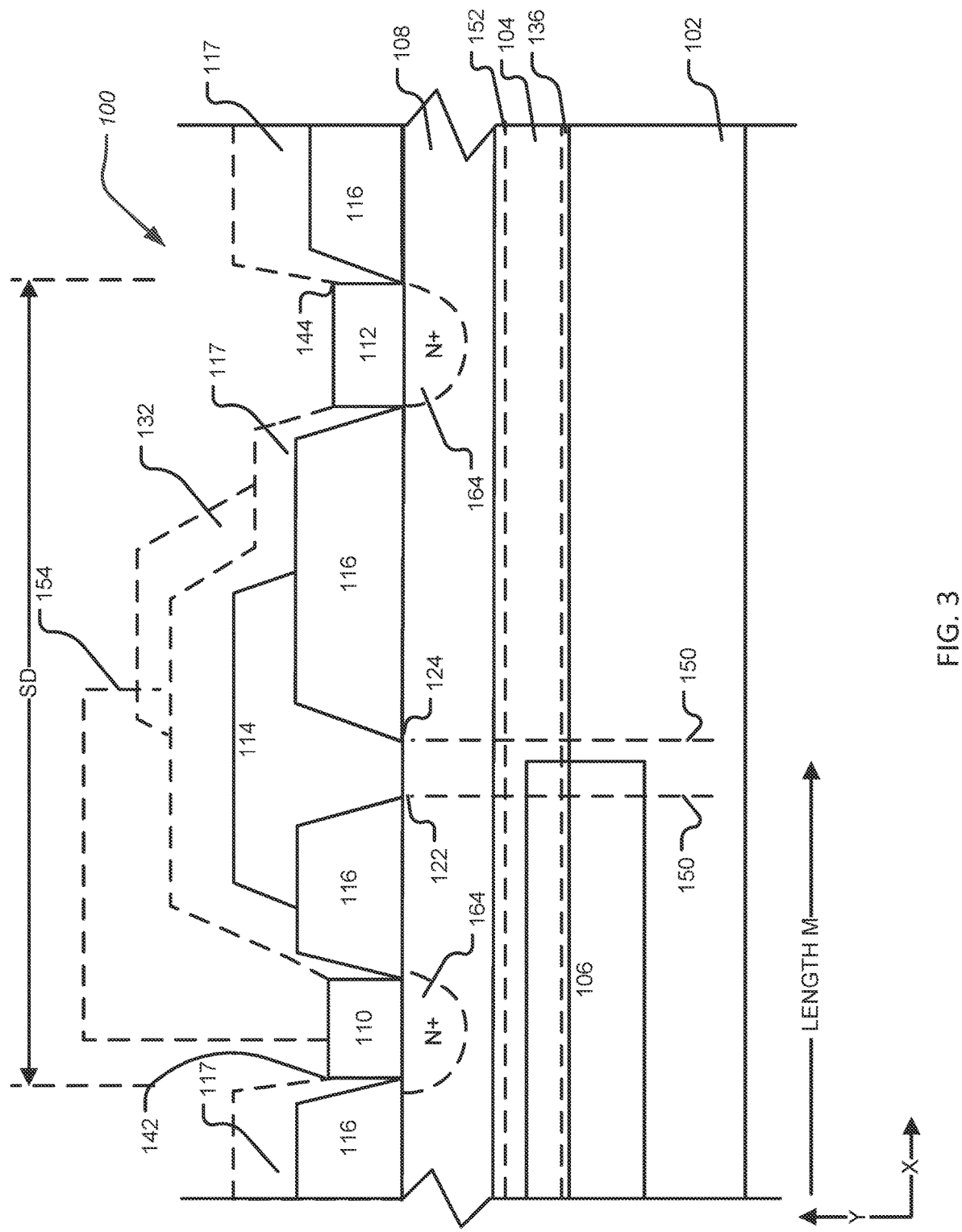
FIG. 3 shows a cross-sectional view of an aspect of the transistor according to FIG. 1.

FIG. 3 shows a cross-sectional view of an aspect of the transistor according to FIG. 1.

In particular, FIG. 3 illustrates a transistor 100 that may include any one or more aspects of the disclosure described herein. In one aspect, the conductive material layer 106 may not extend over the entire area of the substrate layer 102 as shown by the arrow LENGTH M as shown in FIG. 3. In this regard, the conductive material layer 106 may be selectively arranged as described in detail below, the conductive material layer 106 may be arranged over the entire length and selectively removed as described in detail below, the conductive material layer 106 may be arranged over the entire length and selectively electrically neutralized as described in detail below, or the like. Accordingly, the specific constructions of the conductive material layer 106 described below encompass any of these configurations that result in the conductive material layer 106 having an operating construction and arrangement as noted below. In other words, the length and/or size of the conductive material layer 106 does not include a part that is partially electrically neutralized or partially etched. The length and/or size of the conductive material layer 106 may depend on the application of the transistor 100, requirements for the transistor 100, and the like.

With reference to the aspects further described below, the conductive material layer 106 may extend horizontally along the X axis parallel to the arrow LENGTH M. Moreover, the conductive material layer 106 may extend horizontally parallel to the arrow LENGTH M to a point defined by a line that is perpendicular (parallel to the y-axis) to the arrow LENGTH M and extends through a component of the transistor 100 as illustrated.

In one aspect, of the disclosure, the conductive material layer 106 may extend laterally from at least beneath the source 110 to a position beneath a first edge 124 of the gate 114. In particular, the first edge 124 may be an edge of the gate 114 on a side of the gate 114 adjacent the drain 112 and which may also be a lowest surface of the gate 114.

In certain aspects of the disclosure, the conductive material layer 106 may extend to a point within about 0 to about 0.7 μm of a first edge 124 of the gate 114. In certain aspects of the disclosure, the conductive material layer 106 may extend to a point within about 0 to about 0.5 μm of the first edge 124 of the gate 114. In certain aspects of the disclosure, the conductive material layer 106 may extend to a point within about 0 to about 0.3 μm of the first edge 124 of the gate 114.

In one aspect, of the disclosure, the conductive material layer 106 may extend laterally from at least beneath the source 110 to a position beneath a second edge 122 of the gate 114. In particular, the second edge 122 may be an edge of the gate 114 on a side of the gate 114 adjacent the source 110 and which may also be a lowest surface of the gate 114.

In certain aspects of the disclosure, the conductive material layer 106 may extend to a point within about 0 to about 0.7 μm of the second edge 122 of the gate 114. In certain aspects of the disclosure, the conductive material layer 106 may extend to a point within about 0 to about 0.5 μm of the second edge 122 of the gate 114. In certain aspects of the disclosure, the conductive material layer 106 may extend to a point within about 0 to about 0.3 μm of the second edge 122 of the gate 114.

In other aspects, a length of the conductive material layer 106 LENGTH M can also be seen in relation to positions and/or lengths of other components based on the length SD as illustrated in FIG. 3. The length SD in this case may be the length between an edge 142 of the source 110 toward an edge 144 of the drain 112 as shown in FIG. 3. In particular, the edge 142 may be defined as an edge or surface on the source 110 that is parallel to the Y axis on a side of the source 110 opposite to the gate 114; and, the edge 144 may be defined as an edge or surface on the drain 112 that is parallel to the Y axis on a side of the drain 112 opposite to the gate 114.

In one aspect, the length of the conductive material layer 106 may extend from 10% to 20% of the length of SD, meaning the conductive material layer 106 may extend 10% to 20% past the edge 142 of the source 110 toward the drain 112. In one aspect, the length of the conductive material layer 106 may extend from 20% to 30% of the length of SD, meaning the conductive material layer 106 may extend 20% to 30% past the edge 142 of the source 110 toward the drain 112. In one aspect, the length of the conductive material layer 106 may extend from 30% to 40% of the length of SD, meaning the conductive material layer 106 may extend 30% to 40% past the edge 142 of the source 110 toward the drain 112. In one aspect, the length of the conductive material layer 106 may extend from 40% to 50% of the length of SD, meaning the conductive material layer 106 may extend 40% to 50% past the edge 142 of the source 110 toward the drain 112. In one aspect, the length of the conductive material layer 106 may extend from 50% to 60% of the length of SD, meaning the conductive material layer 106 may extend 50% to 60% past the edge 142 of the source 110 toward the drain 112. In one aspect, the length of the conductive material layer 106 may extend from 60% to 70% of the length of SD, meaning the conductive material layer 106 may extend 60% to 70% past the edge 142 of the source 110 toward the drain 112. In one aspect, the length of the conductive material layer 106 may extend from 70% to 80% of the length of SD, meaning the conductive material layer 106 may extend 70% to 80% past the edge 142 of the source 110 toward the drain 112.

Figure 4:
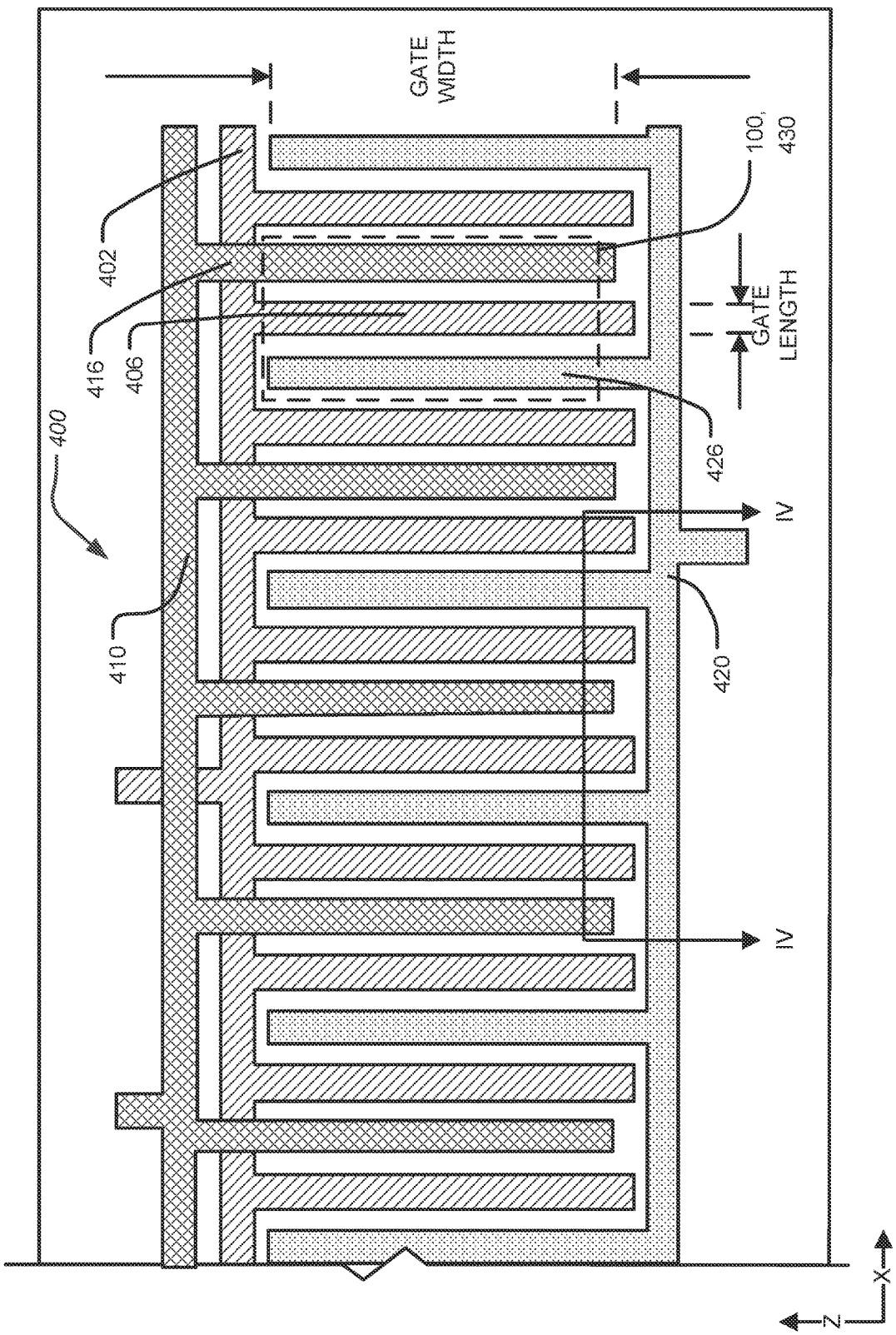
FIG. 4 illustrates a semiconductor device that may include a plurality of unit cell transistors in accordance with an aspect of the disclosure.

FIG. 4 illustrates a semiconductor device that may include a plurality of unit cell transistors in accordance with an aspect of the disclosure.

In particular, FIG. 4 illustrates a semiconductor device 400 that may include any one or more aspects of the disclosure described herein. As shown in FIG. 4, aspects of the disclosure may include a semiconductor device 400 that may include a plurality of the transistor 100. In particular, the transistor 100 may be one of a plurality of unit cells 430 implemented in the semiconductor device 400.

In particular, FIG. 4 illustrates a transistor 100 that may include any one or more aspects of the disclosure described herein. In particular, the transistor 100 of FIG. 4 may include the conductive material layer 106 as described above. In this regard, the transistor 100 of FIG. 4 implements a length of the conductive material layer 106 as described herein that reduces lag effect, avoids adverse effects on RF performance for certain transistor applications, and/or the like.

The semiconductor device 400 may include a gate bus 402 that may be connected to a plurality of gate fingers 406 that may extend in parallel in a first direction (e.g., the Z-direction indicated in FIG. 4) that connect to or form part of the gate 114. A source bus 410 may be connected to a plurality of parallel ones of source contacts 416 that connect to or form part of the source 110. In some aspects, the source bus 410 may be connected to a ground voltage node on an underside of the semiconductor device 400. A drain bus 420 may be connected to a plurality of drain contacts 426 that connect to or form part of the drain 112.

As can be seen in FIG. 4, each gate finger 406 may run along the Z-direction between a pair of adjacent ones of the source contact 416 and the drain contact 426. The semiconductor device 400 may include a plurality of unit cells 430, where each one of the plurality of unit cells 430 includes an implementation of the transistor 100. One of the plurality of unit cells 430 is illustrated by the dashed Box in FIG. 4, and includes a gate finger 406 that extends between adjacent ones of the source contact 416 and the drain contact 426.

The "gate width" refers to the distance by which the gate finger 406 overlaps with its associated one of the source contact 416 and drain contact 426 in the Z-direction. That is, "width" of a gate finger 406 refers to the dimension of the gate finger 406 that extends in parallel to and adjacent an implementation of the source contact 416 and the drain contact 426 (the distance along the Z-direction). Each of the plurality of unit cells 430 may share one of the source contact 416 and/or the drain contact 426 with one or more adjacent ones of the plurality of unit cells 430. Although a particular number of the of the plurality of unit cells 430 is illustrated in FIG. 4, it will be appreciated that the semiconductor device 400 may include more or less of the plurality of unit cells 430.

Figure 5:
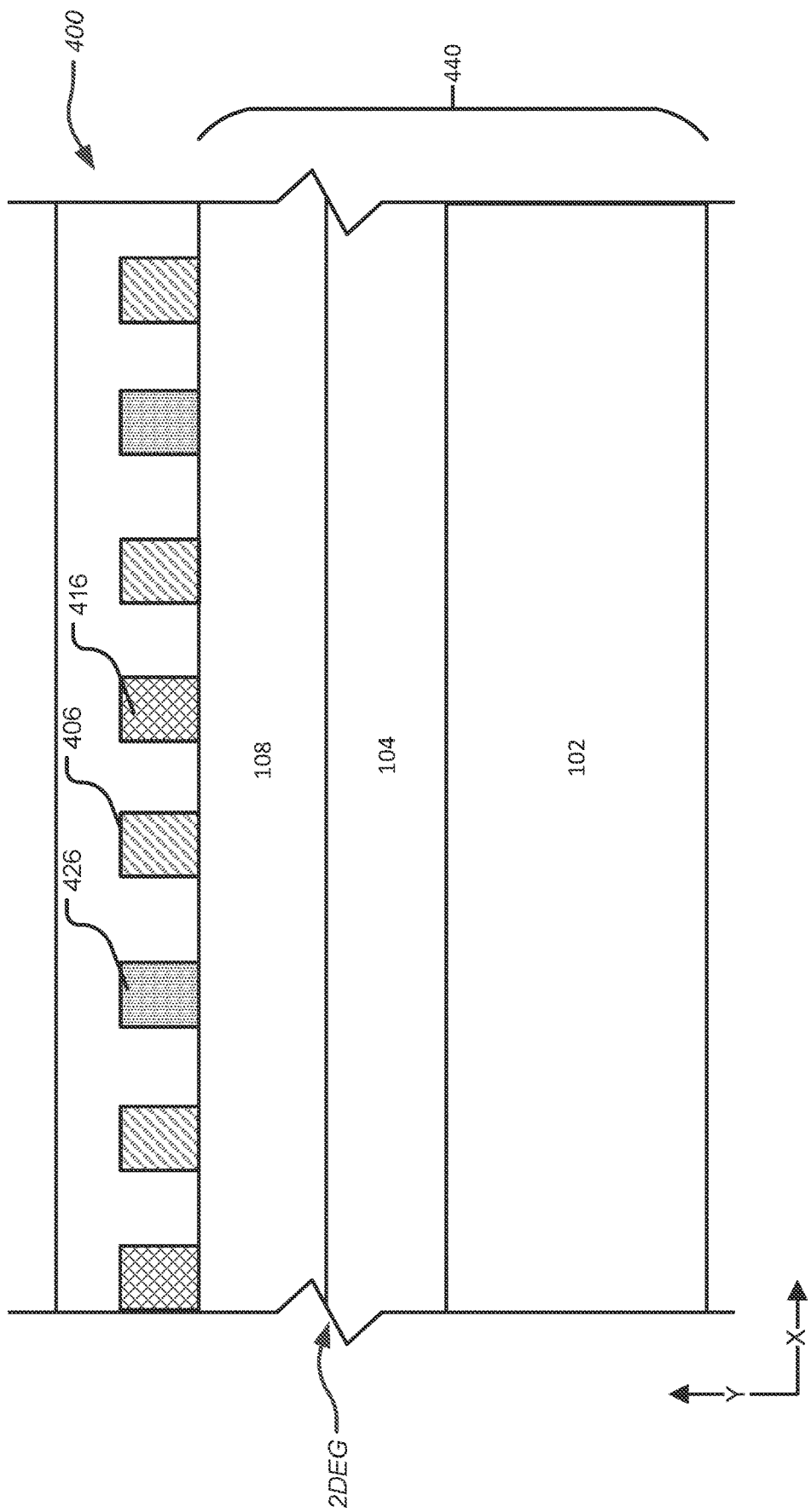
FIG. 5 is a schematic cross-sectional view taken along line IV-IV of FIG. 4.

FIG. 5 is a schematic cross-sectional view taken along line IV-IV of FIG. 4.

In particular, FIG. 5 illustrates a semiconductor device 400 that may include any one or more aspects of the disclosure described herein. Referring to FIG. 5, the semiconductor device 400 may include a semiconductor structure 440 that includes the substrate layer 102, the buffer layer 104, the barrier layer 108, and/or the like as described herein. The source contact 416 and the drain contact 426 may be on the barrier layer 108 as described herein. The gate fingers 406 may be on the substrate layer 102 between the source contacts 416 and the drain contacts 426 as described herein. While the gate fingers 406, the source contact 416, and the drain contacts 426 are all shown schematically in FIG. 4 and FIG. 5 as having a similar "dimension," it will be appreciated that each may have different shapes and dimensions consistent with the disclosure.

FIG. 6 shows a cross-sectional view of another aspect of a transistor according to the disclosure.

In particular, FIG. 6 illustrates a transistor 100 that may include any one or more aspects of the disclosure described herein. In particular, the transistor 100 of FIG. 6 may include the conductive material layer 106 as described above. In this regard, the transistor 100 of FIG. 6 implements a length of the conductive material layer 106 as described herein that reduces lag effect, avoids adverse effects on RF performance for certain transistor applications, and/or the like. In particular, FIG. 6 illustrates a transistor 100 that may include any one or more aspects of the disclosure described herein. In particular, the transistor 100 of FIG. 6 may include the conductive material layer 106 as described above. In this regard, the transistor 100 of FIG. 6 implements a length of the conductive material layer 106 as described herein that reduces lag effect, avoids adverse effects on RF performance for certain transistor applications, and/or the like.

FIG. 6 further illustrates implementation of the second spacer layer 117. The second spacer layer 117 may be provided over the gate 114 and/or the spacer layer 116. The second spacer layer 117 may be a passivation layer made of SiN, AlO, SiO, $SiO_2$, AlN, or the like, or a combination incorporating multiple layers thereof.

In one aspect, the second spacer layer 117 is a passivation layer made of SiN. In one aspect, the second spacer layer 117 can be deposited using MOCVD, plasma chemical vapor deposition (CVD), hot-filament CVD, or sputtering. In one aspect, the second spacer layer 117 may include deposition of $Si_3N_4$. In one aspect, the second spacer layer 117 forms an insulating layer. In one aspect, the second spacer layer 117 forms an insulator. In one aspect, the second spacer layer 117 may be a dielectric. In one aspect, a second spacer layer 117 may be provided on the spacer layer 116. In one aspect, the second spacer layer 117 may include non-conducting material such as a dielectric. In one aspect, the second spacer layer 117 may include a number of different layers of dielectrics or a combination of dielectric layers. In one aspect, the second spacer layer 117 may be many different thicknesses, with a suitable range of thicknesses being approximately 0.5 to 2 microns. In one aspect, the second spacer layer 117 may include a material such as a Group III nitride material having different Group III elements such as alloys of Al, Ga, or In, with a suitable spacer layer material being $Al_xIn_yGa_{1-x-y}$ (where $0<=x<=1$ and $0<=y<=1$, $x+y<=1$).

Figure 7:
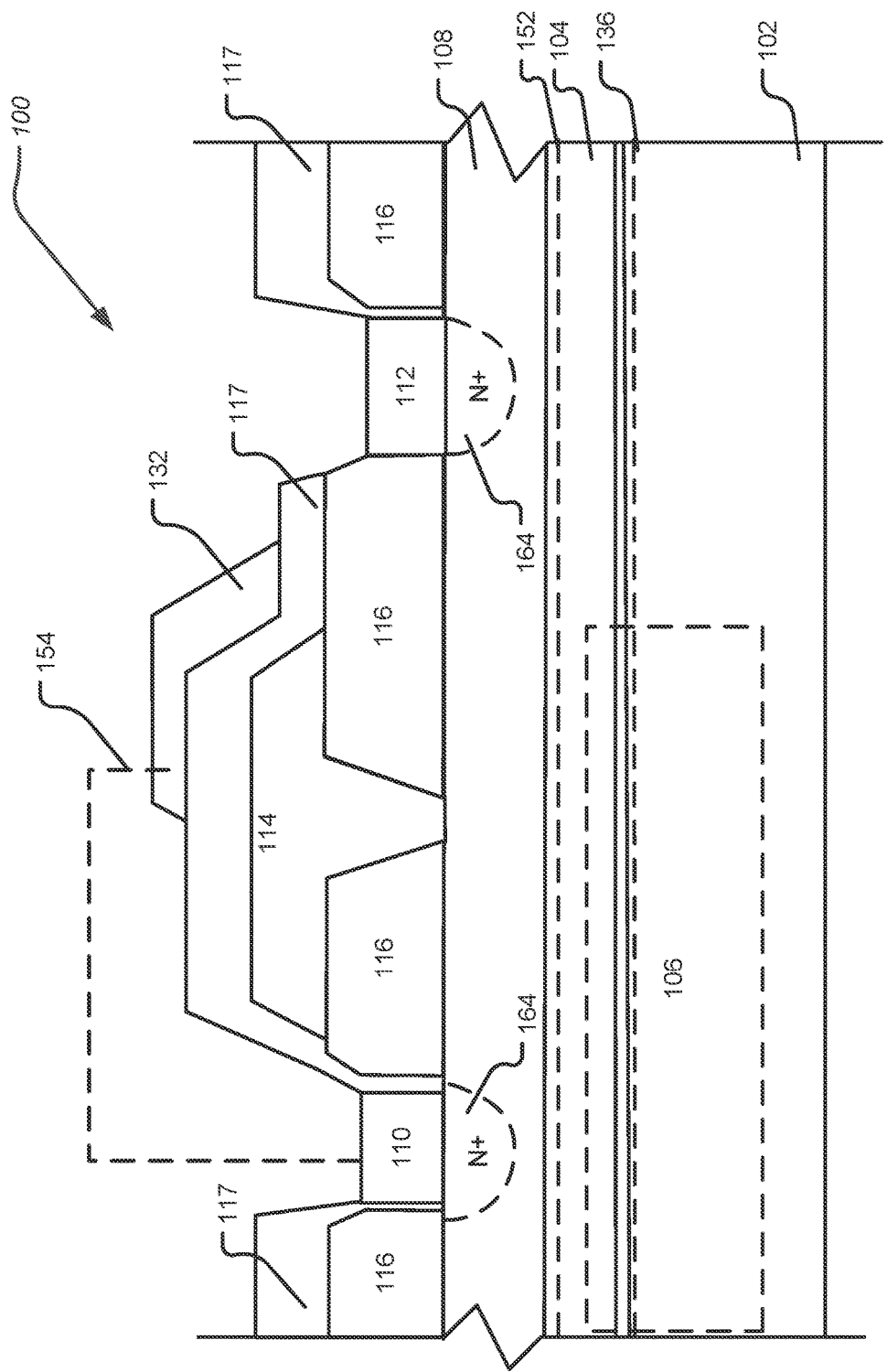
FIG. 7 shows a cross-sectional view of another aspect of a transistor according to the disclosure.

FIG. 7 shows a cross-sectional view of another aspect of a transistor according to the disclosure.

In particular, FIG. 7 illustrates a transistor 100 that may include any one or more aspects of the disclosure described herein. The transistor 100 of FIG. 7 may include the conductive material layer 106 as described above. In particular, FIG. 7 illustrates a transistor 100 that may include any one or more aspects of the disclosure described herein. In particular, the transistor 100 of FIG. 7 may include the conductive material layer 106 as described above. In this regard, the transistor 100 of FIG. 7 implements a length of the conductive material layer 106 as described herein that reduces lag effect, avoids adverse effects on RF performance for certain transistor applications, and/or the like.

FIG. 7 further illustrates implementation of the field plate 132. In one aspect, the field plate 132 may be arranged on the second spacer layer 117 between the gate 114 and drain 112. In one aspect, the field plate 132 may be deposited on the second spacer layer 117 between the gate 114 and the drain 112. In one aspect, the field plate 132 may be electrically connected to one or more other components in the transistor 100. In one aspect, the field plate 132 may not be electrically connected to any other components of the transistor 100. In some aspects, the field plate 132 may be adjacent the gate 114 and a second spacer layer 117 of dielectric material may be included at least partially over the gate 114 to isolate the gate 114 from the field plate 132. In some aspects, the field plate 132 may overlap the gate 114 and a second spacer layer 117 of dielectric material may be included at least partially over the gate 114 to isolate the gate 114 from the field plate 132.

The field plate 132 may extend different distances from the edge of the gate 114, with a suitable range of distances being approximately 0.1 to 2 microns. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the field plate 132 may be formed on the second spacer layer 117 between the gate 114 and the drain 112, with the field plate 132 being in proximity to the gate 114 but not overlapping the gate 114. In one aspect, a space between the gate 114 and field plate 132 may be wide enough to isolate the gate 114 from the field plate 132, while being small enough to maximize a field effect provided by the field plate 132.

In certain aspects, the field plate 132 may reduce a peak operating electric field in the transistor 100. In certain aspects, the field plate 132 may reduce the peak operating electric field in the transistor 100 and may increase the breakdown voltage of the transistor 100. In certain aspects, the field plate 132 may reduce the peak operating electric field in the transistor 100 and may reduce trapping in the transistor 100. In certain aspects, the field plate 132 may reduce the peak operating electric field in the transistor 100 and may reduce leakage currents in the transistor 100.

In other aspects, for example, the spacer layer 116 is formed on the barrier layer 108 and on the gate 114. In such aspects, the field plate 132 can be formed directly on the spacer layer 116. Other multiple field plate configurations are possible with the field plate 132 overlapping or non-overlapping with the gate 114 and/or multiple field plates 132 being used.

Figure 8:
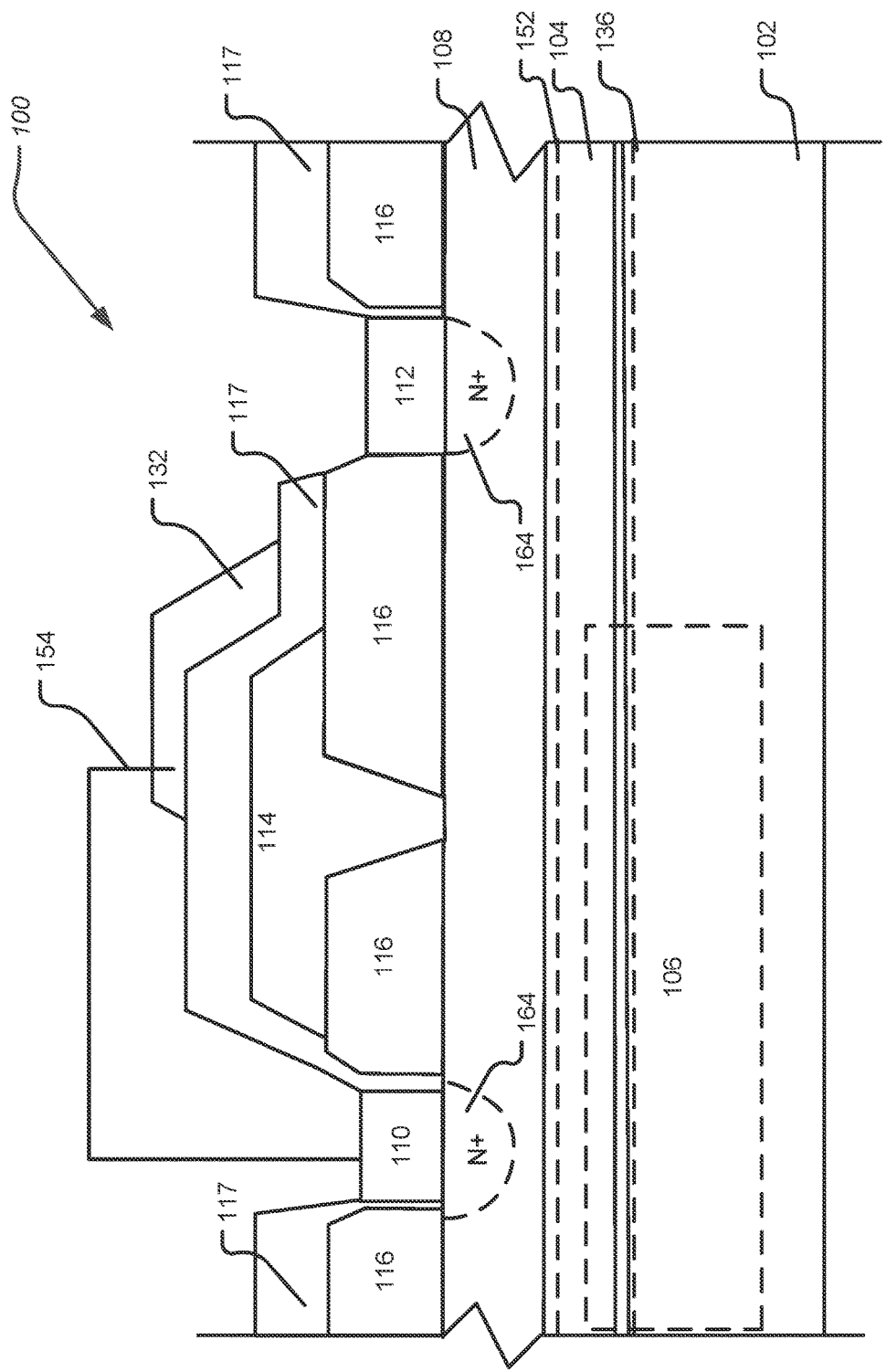
FIG. 8 shows a cross-sectional view of another aspect of a transistor according to the disclosure.

FIG. 8 shows a cross-sectional view of another aspect of a transistor according to the disclosure.

In particular, FIG. 8 illustrates a transistor 100 that may include any one or more aspects of the disclosure described herein. In particular, the transistor 100 of FIG. 8 may include the conductive material layer 106 as described above. FIG. 8 further illustrates implementation of the field plate 132 that may be electrically connected to the source 110 through a connection 154. Additionally or alternatively, the field plate 132 may be connected to the gate 114 through a connection (gate-field plate interconnect (not shown)). In particular, FIG. 8 illustrates a transistor 100 that may include any one or more aspects of the disclosure described herein. In particular, the transistor 100 of FIG. 8 may include the conductive material layer 106 as described above. In this regard, the transistor 100 of FIG. 8 implements a length of the conductive material layer 106 as described herein that reduces lag effect, avoids adverse effects on RF performance for certain transistor applications, and/or the like.

In one aspect, the connection 154 may be formed on the spacer layer 116 and/or the second spacer layer 117 to extend between the source 110 and the field plate 132. In some aspects, the connection 154 may include a conductive material, many different conductive materials, a suitable material being a metal, or combinations of metals, deposited using standard metallization methods. In one aspect, the materials may include one or more of titanium, gold, nickel, or the like.

In one aspect, the gate-field plate interconnect may be formed on the spacer layer 116 and/or the second spacer layer 117 to extend between the gate 114 and the field plate 132. In some aspects, the gate-field plate interconnect may include a conductive material, many different conductive materials, a suitable material being a metal, or combinations of metals, deposited using standard metallization methods. In one aspect, the materials may include one or more of titanium, gold, nickel, or the like.

In particular, the transistor 100 of FIG. 8 illustrates the field plate 132 connected to the source 110 through the connection 154 (source-field plate interconnect). In one aspect, the connection 154 may be formed on the spacer layer 116 and/or the second spacer layer 117 to extend between the field plate 132 and the source 110. In one aspect, the connection 154 may be formed with the field plate 132 during the same manufacturing step. In one aspect, a plurality of the connection 154 and/or a plurality of gate-field plate interconnect may be used. In one aspect, a plurality of the field plates 132 may be used. In one aspect, a plurality of the field plates 132 may be used and each of the plurality of field plates 132 may be stacked with a dielectric material therebetween. In some aspects, the connection 154 and/or the gate-field plate interconnect may include a conductive material, many different conductive materials, a suitable material being a metal, or combinations of metals, deposited using standard metallization methods. In one aspect, the materials may include one or more of titanium, gold, nickel, or the like.

In one aspect of the transistor 100 described herein, the gate 114 may be formed of platinum (Pt), nickel (Ni), and/or gold (Au), however, other metals known to one skilled in the art to achieve the Schottky effect, may be used. In one aspect, the gate 114 may include a Schottky gate contact that may have a three-layer structure. Such a structure may have advantages because of the high adhesion of some materials. In one aspect, the gate 114 may further include an overlayer of highly conductive metal. In one aspect, the gate 114 may be configured as a T-shaped gate.

In one aspect of the transistor 100 described herein, one or more metal overlayers may be provided on one or more of the source 110, the drain 112, and the gate 114. The overlayers may be Au, Silver (Ag), Al, Pt, Ti, Si, Ni, Al, and/or Copper (Cu).

In one aspect of the transistor 100 described herein, a second buffer layer may be deposited or grown on a first implementation of the buffer layer 104 on a side of the first implementation of the buffer layer 104 opposite of the substrate layer 102. In one aspect, the second buffer layer may be formed directly on the first implementation of the buffer layer 104. In one aspect, the second buffer layer may be a high-purity material such as Gallium Nitride (GaN), AlN, or the like. In one aspect, the second buffer layer may be a high-purity GaN. In one aspect, the second buffer layer may be a high-purity AlN. The second buffer layer may be a p-type material or n-type material. In another aspect, the second buffer layer may be undoped.

Figure 9:
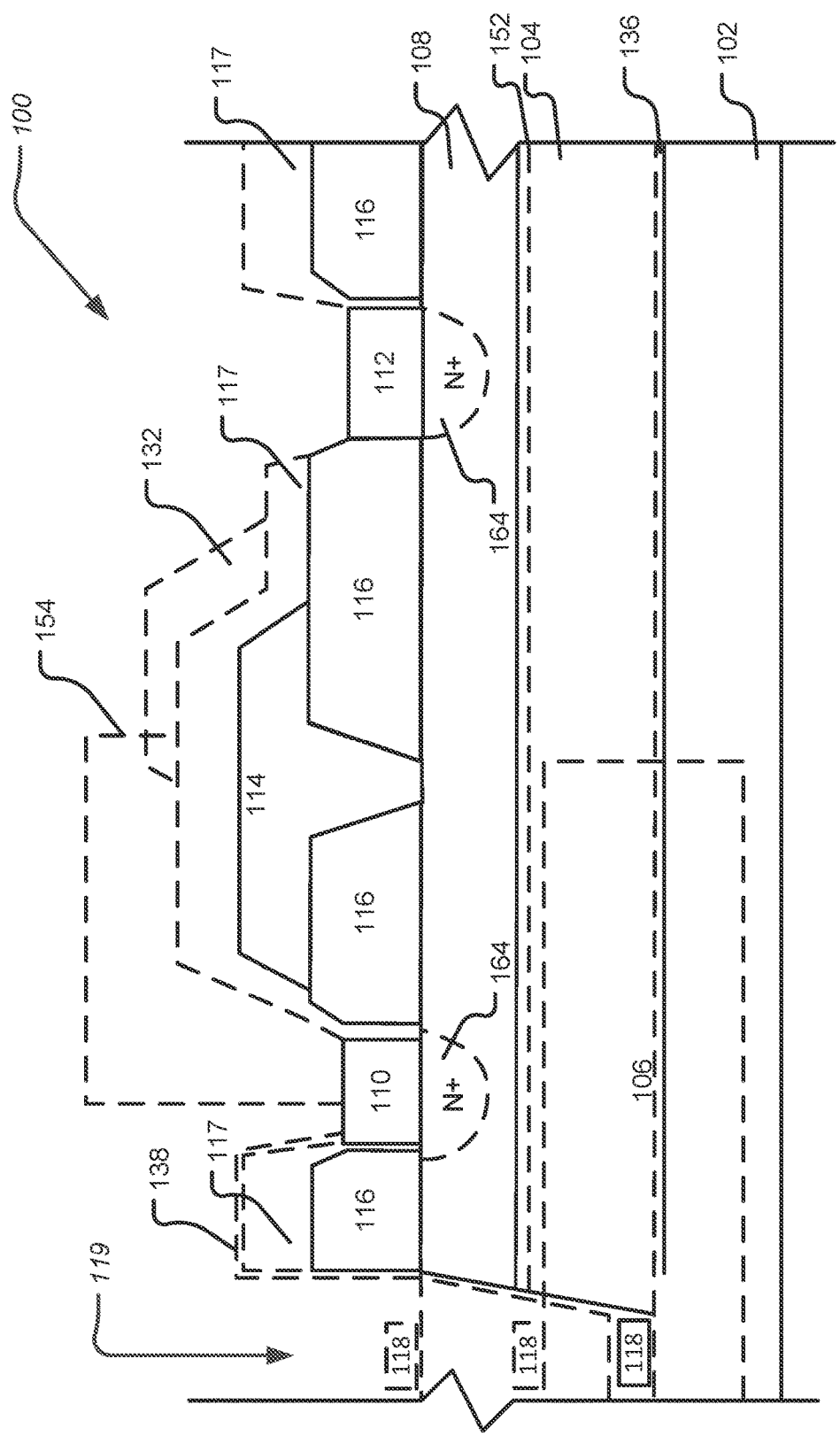
FIG. 9 shows a cross-sectional view of another aspect of a transistor according to the disclosure.

FIG. 9 shows a cross-sectional view of another aspect of a transistor according to the disclosure.

In particular, FIG. 9 illustrates a transistor 100 that may include any one or more aspects of the disclosure described herein. In particular, the transistor 100 of FIG. 9 may include the conductive material layer 106 as described above. FIG. 9 further illustrates implementation of the field plate 132 that may be electrically connected to the source 110 through a connection 154. In particular, FIG. 9 illustrates a transistor 100 that may include any one or more aspects of the disclosure described herein. In particular, the transistor 100 of FIG. 9 may include the conductive material layer 106 as described above. In this regard, the transistor 100 of FIG. 9 implements a length of the conductive material layer 106 as described herein that reduces lag effect, avoids adverse effects on RF performance for certain transistor applications, and/or the like.

In various aspects of the disclosure, the conductive material layer 106 of the transistor 100 may be buried within the substrate layer 102 and otherwise may not be electrically connected to any portion of the transistor 100. In one aspect as illustrated in FIG. 9, the transistor 100 may include a contact 118 that may be electrically connected to receive an external signal, bias, and/or the like. The contact 118 may be electrically connected and arranged in the substrate layer 102, the conductive material layer 106, the substrate layer 102, the buffer layer 104, the barrier layer 108, and/or the like. The contact 118 may be formed in a recess 119 in the substrate layer 102, the conductive material layer 106, the substrate layer 102, the buffer layer 104, the barrier layer 108, and/or the like. The recess 119 may extend down to the conductive material layer 106 to allow for the contact 118 to be created there. The recess 119 may be formed by etching, and may also use a material to define the recess 119. The material may be removed after the recess 119 has been created.

In particular, the recess 119 may remove any material above the conductive material layer 106 within a portion of a region associated with the source 110, exposing the conductive material layer 106 on a side opposite of the substrate layer 102. In another aspect of the disclosure, to create a place for the contact 118, a recess 119 may be created by removing at least part of the substrate layer 102, the conductive material layer 106, the substrate layer 102, the buffer layer 104, the barrier layer 108, and/or the like.

In certain embodiments, the source 110 may be electrically connected to the contact 118 through a connection 138. In certain embodiments, the field plate 132 may be electrically connected to the source 110 through the connection 154. In certain embodiments, the field plate 132 may be connected to the source 110, and the source 110 may be connected to the contact 118 through the connection 138. In certain embodiments, the source 110 may be electrically connected to the conductive material layer 106 through the connection 138. In other embodiments, the source 110 may not be electrically connected to the conductive material layer 106. In various aspects of the disclosure, the conductive material layer 106 of the transistor 100 may be buried and otherwise may not be electrically connected to any portion of the transistor 100.

In certain embodiments, the gate 114 may be electrically connected to the contact 118 through a connection (not shown). In certain embodiments, the field plate 132 may be electrically connected to the gate 114 through the connection. In certain embodiments, the field plate 132 may be connected to the gate 114, and the gate 114 may be connected to the contact 118 through the connection. In certain embodiments, the gate 114 may be electrically connected to the conductive material layer 106 through the connection. In other embodiments, the gate 114 may not be electrically connected to the conductive material layer 106.

FIG. 9 is meant to broadly describe different embodiments of the present invention (e.g., different conductive material layer and/or field plate configurations), but in the interest of clarity, not all embodiments are expressly depicted. It should be understood that the transistor 100 structures of the present invention can be utilized with a variety of conductive material layer 106 structures as described herein and otherwise. In certain embodiments, the conductive material layer 106 structure may be electrically connected to a separate bias voltage/control signal, electrically connected to the source 110 or electrically connected to the gate 114 or not electrically connected to the source 110, the gate 114, and the separate bias/control signal. Such electrical connection can be through a via in the epitaxial material and/or an electrical connection outside and/or at an edge of the epitaxial material. For example, the via may be structured within the recess 119. The conductive material layer 106 can be formed or structured in any of the different variations described herein or otherwise. Depending on the embodiment, various field plate 132 configurations are possible. For example, field plates 132 may be integral with the gate 114, single or multiple field plates 132 are possible with or without intervening dielectric spacer layers between the field plates 132. A field plate 132 can vertically overlap or not vertically overlap with the gate 114 or an underlying field plate 132. The field plates 132 may be electrically connected to the gate 114 or the source 110 or one or more field plates 132 connected to the gate 114, one or more field plates 132 connected to the source 110, and/or one or more field plates 132 connected to neither the source 110 nor the gate 114.

Figure 10:
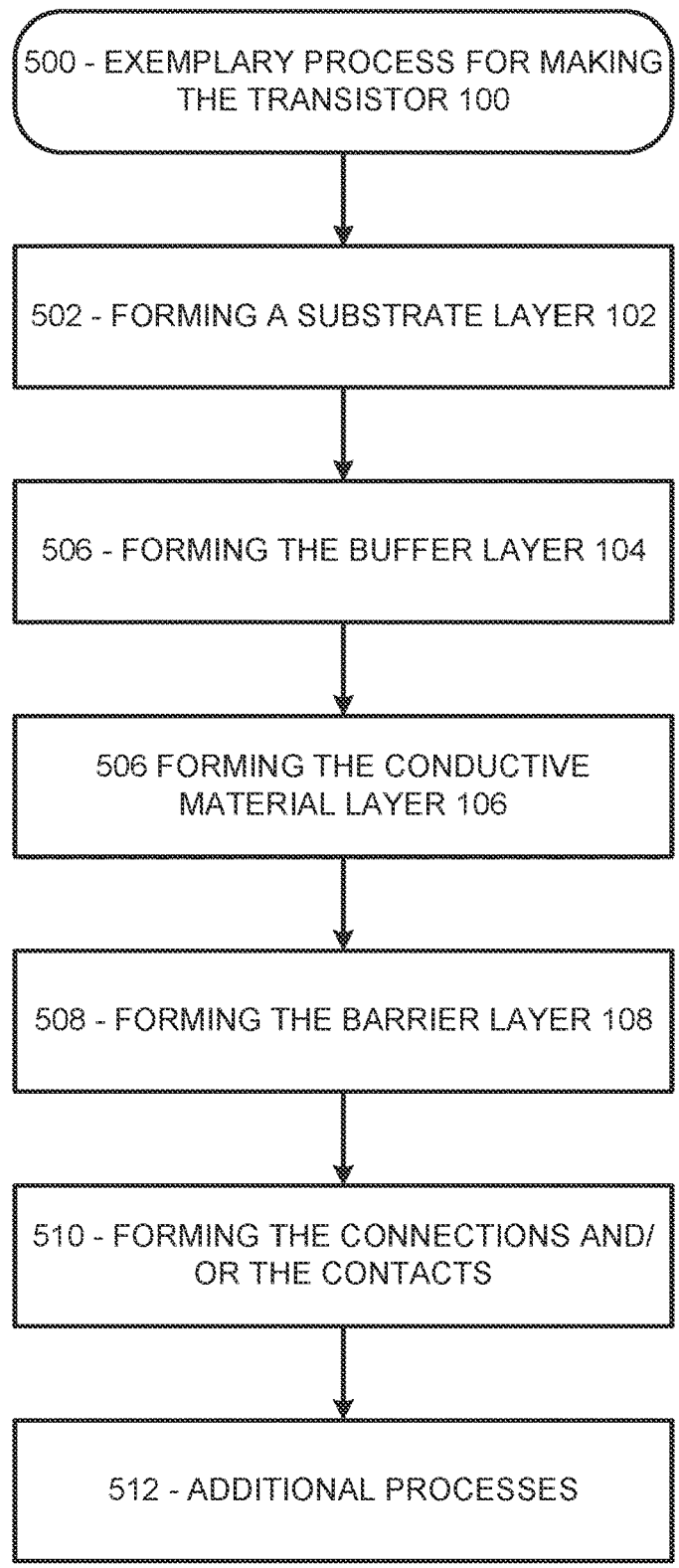
FIG. 10 shows a process for making a transistor according to the disclosure.

FIG. 10 shows a process for making a transistor according to the disclosure.

In particular, FIG. 10 illustrates a process for making a transistor 100 and/or a semiconductor device 400 that may include any one or more aspects of the disclosure described herein. In this regard, FIG. 10 shows an exemplary process 500 for making the transistor 100 of the disclosure. It should be noted that the process 500 is merely exemplary and may be modified consistent with the various aspects disclosed herein. In particular, the process 500 may include any one or more aspects of the disclosure described herein. In particular, the process 500 may include making the conductive material layer 106 as described above. In this regard, the process 500 implements a length of the conductive material layer 106 as described herein that reduces lag effect, avoids adverse effects on RF performance for certain transistor applications, and/or the like.

The process 500 may begin at step 502 by forming a substrate layer 102. The substrate layer 102 may be formed consistent with the disclosure. For example, the substrate layer 102 may be made of Silicon Carbide (SiC). In some aspects, the substrate layer 102 may be a semi-insulating SiC substrate, a p-type substrate, an n-type substrate, and/or the like. In some aspects, the substrate layer 102 may be very lightly doped. In one aspect, the background impurity levels may be low. In one aspect, the background impurity levels may be $1E15/cm^3$ or less. The substrate layer 102 may be formed of SiC selected from the group of 6H, 4H, 15R, 3C SiC, or the like. In another aspect, the substrate layer 102 may be GaAs, GaN, or other material suitable for the applications described herein. In another aspect, the substrate layer 102 may include sapphire, spinel, ZnO, silicon, or any other material capable of supporting growth of Group III-nitride materials.

The process 500 may include a step 504 of forming the buffer layer 104 on the substrate layer 102. The buffer layer 104 may be grown or deposited on the substrate layer 102 as described in the disclosure. In one aspect, the buffer layer 104 may be GaN. In another aspect, the buffer layer 104 may be formed with LEO. In one aspect, a nucleation layer 136 may be formed on the substrate layer 102 and the buffer layer 104 may be formed at step 504 on the nucleation layer 136. The buffer layer 104 may be grown or deposited on the nucleation layer 136. In one aspect, the buffer layer 104 may be GaN. In another aspect, the buffer layer 104 may be formed with LEO.

The process 500 may include a step 506 of forming the conductive material layer 106. The conductive material layer 106 may be formed within the substrate layer 102. The conductive material layer 106 may be provided solely in the substrate layer 102, extend from the substrate layer 102 to epitaxial layers within the transistor 100, or located solely in one or more of the epitaxial layers of the transistor 100. In aspects, conductive material layer 106 may be formed within the buffer layer 104. In aspects, the conductive material layer 106 may be arranged in one or more of the substrate layer 102, the buffer layer 104, the barrier layer 108, and/or the like.

The conductive material layer 106 can span multiple layers and include multiple areas of different or graded conductive material. In accordance with other aspects of the disclosure, the conductive material layer 106 may also be formed below the barrier layer 108 between the barrier layer 108 and the substrate layer 102 and/or within the substrate layer 102.

In one or more aspects, the conductive material layer 106 may be a conductive material, a metal material, a superconducting material, a conductive layer, a metal layer, a superconducting layer, a conductive portion, a metal portion, a superconducting portion, a metallic material, a metallic layer, a metallic portion, and/or the like. In one or more aspects, the conductive material layer 106 may have a good lattice match to one or more layers of the transistor 100. In one or more aspects, the conductive material layer 106 may have a good lattice match to the buffer layer 104 and/or the substrate layer 102. In one or more aspects, the conductive material layer 106 may have a good lattice match to GaN layers of the transistor 100 and/or of the substrate layer 102. In one or more aspects, the conductive material layer 106 may have a good lattice match to GaN layers of the transistor 100 and/or also to SiC implementations of the substrate layer 102.

However, having the conductive material layer 106 everywhere under the channel of the transistor 100 may adversely affect RF performance of the transistor 100. Accordingly, the disclosure in aspects forms the conductive material layer 106 only in part of the region under the GaN HEMT channel of the transistor 100 to maintain good RF performance.

The conductive material layer 106 may be configured to be lattice matched with other layers of the transistor 100, such as the substrate layer 102, the buffer layer 104, the barrier layer 108, and/or the like. In this regard, the conductive material layer 106 may be configured to be lattice matched with other layers of the transistor 100 and may reduce leakage without trapping. In one or more aspects, the conductive material layer 106 may be formed only in part of the region between the source 110 and the drain 112 to achieve good RF performance.

In one aspect, the conductive material layer 106 may be grown selectively on the buffer layer 104. In one aspect, the conductive material layer 106 may be a conductive material, a metal material, a superconducting material, a metallic material, a metallic layer, a metallic portion, and/or the like that may be grown selectively on the buffer layer 104. In one aspect, the conductive material layer 106 may be a conductive material, a metal material, a superconducting material, a metallic material, a metallic layer, a metallic portion, and/or the like that may be grown selectively the buffer layer 104.

In one aspect, the conductive material layer 106 may be grown selectively on the substrate layer 102. In one aspect, the conductive material layer 106 may be grown selectively on a SiC implementation of the substrate layer 102. In one aspect, the conductive material layer 106 may be a conductive material, a metallic material, a superconducting material, a metallic material, a metallic layer, a metallic portion, and/or the like that may be grown selectively on the substrate layer 102. In one aspect, the conductive material layer 106 may be a conductive material, a metallic material, a superconducting material, a metallic material, a metallic layer, a metallic portion, and/or the like that may be grown selectively on a SiC implementation of the substrate layer 102.

In one aspect, the conductive material layer 106 may be NbN that may be grown selectively on the substrate layer 102 and/or the buffer layer 104. In one aspect, the conductive material layer 106 may be NbN that may be grown selectively on a SiC implementation of the substrate layer 102 and/or the buffer layer 104.

In one aspect, the conductive material layer 106 may be patterned selectively on the substrate layer 102 and/or the buffer layer 104. In one aspect, the conductive material layer 106 may be patterned selectively on a SiC implementation of the substrate layer 102 and/or the buffer layer 104.

In one aspect, the conductive material layer 106 may be a patterned NbN layer. In one aspect, the conductive material layer 106 may be a patterned NbN buried layer.

In one aspect, one or more layers of the transistor 100 may be masked and the conductive material layer 106 grown on the substrate layer 102 and/or the buffer layer 104. In one aspect, the conductive material layer 106 may be grown on the substrate layer 102 and/or the buffer layer 104 and then etched.

In one aspect, the conductive material layer 106 may be NbN formed inside a hole etched into a layer of the transistor 100 such as the buffer layer 104, the barrier layer 108, a first GaN layer, and/or the like. Thereafter, the conductive material layer 106 may be planarized.

In one aspect, the conductive material layer 106 may be an epitaxial integration of the semiconducting and superconducting nitride lattice constants of Nb-based nitride metals such as hexagonal Nb₂N, hexagonal NbN, cubic NbN, and/or the like that may be close to the lattice constants of one or more of the layers of the transistor 100, such as the substrate layer 102, the buffer layer 104, the barrier layer 108, and/or the like.

In one aspect, the conductive material layer 106 may be implemented by epitaxial metal NbN layers. In one aspect, the conductive material layer 106 may be implemented by growing crystalline epitaxial metal NbN layers on the substrate layer 102 and/or the buffer layer 104.

In one aspect, the conductive material layer 106 may be implemented by growing crystalline epitaxial metal NbN layers by molecular beam epitaxy on the substrate layer 102 and/or the buffer layer 104. In one aspect, the epitaxial layers of NbN implementation of the conductive material layer 106 may exhibit two-dimensional superconductivity.

In one aspect, the conductive material layer 106 may be implemented by growing NbN deposited by electron-beam evaporation or sputtering on the substrate layer 102 and/or the buffer layer 104. In one aspect, the conductive material layer 106 may be implemented by growing NbN utilizing a radio-frequency plasma nitrogen source and lasers to provide the active nitrogen atoms. In one aspect, the conductive material layer 106 may be implemented by growing NbN utilizing an electron-beam source of niobium on the substrate layer 102 and/or the buffer layer 104. In one aspect, the conductive material layer 106 may be implemented by growing NbN on the substrate layer 102 and/or the buffer layer 104 and may include capping with a layer such as an AlN layer. After forming the conductive material layer 106, the process 500 may repeat the step 504 of forming the buffer layer 104 on the conductive material layer 106.

Further during the process 500 as part of step 508, the barrier layer 108 may be formed on the buffer layer 104. The barrier layer 108 may be formed as described in the disclosure. For example, the barrier layer 108 may be an n-type conductivity layer or may be undoped. In one aspect, the barrier layer 108 may be AlGaN.

Further during the process 500 as part of step 510, to create a place for contact with the conductive material layer 106, a recess may be created by removing at least part of the barrier layer 108 and at least part of the buffer layer 104. The recess formation process may remove any material above the conductive material layer 106 within a portion of a region associated with the source 110, exposing the conductive material layer 106 on a side opposite of the substrate layer 102.

Further during the process 500 as part of step 512, the source 110 may be arranged on the barrier layer 108. The source 110 may be an ohmic contact of a suitable material that may be annealed. For example, the source 110 may be annealed at a temperature of from about 500° C. to about 800° C. for about 2 minutes. However, other times and temperatures may also be utilized. Times from about 30 seconds to about 10 minutes may be, for example, acceptable. In some aspects, the source 110 may include Al, Ti, Si, Ni, and/or Pt. In one aspect, a region 164 under the source 110 that is a N+ material may be formed in the barrier layer 108. In one aspect, a region 164 under the drain 112 may be Si doped.

Further during the process 500 as part of step 512, the drain 112 may be arranged on the barrier layer 108. Like the source 110, the drain 112 may be an ohmic contact of Ni or another suitable material, and may also be annealed in a similar fashion. In one aspect, an n+ implant may be used in conjunction with the barrier layer 108 and the contacts are made to the implant. In one aspect, a region 164 under the drain 112 that is a N+ material may be formed in the barrier layer 108. In one aspect, a region 164 under the drain 112 may be Si doped.

Further during the process 500 as part of step 512, the gate 114 may be arranged on the barrier layer 108 between the source 110 and the drain 112. A layer of Ni, Pt, AU, or the like may be formed for the gate 114 by evaporative deposition or another technique. The gate structure may then be completed by deposition of Pt and Au, or other suitable materials. In some aspects, the contacts of the gate 114 may include Al, Ti, Si, Ni, and/or Pt.

Further during the process 500 as part of step 512, the spacer layer 116 may be formed. The spacer layer 116 may be a passivation layer, such as SiN, AlO, SiO, SiO₂, AlN, or the like, or a combination incorporating multiple layers thereof, which may be deposited over the exposed surface of the barrier layer 108.

The source 110 and the drain 112 electrodes may be formed making ohmic contacts such that an electric current flows between the source 110 and drain 112 electrodes via a two-dimensional electron gas (2DEG) induced at the heterointerface 152 between the buffer layer 104 and barrier layer 108 when a gate 114 electrode is biased at an appropriate level. In one aspect, the source 110 may be electrically coupled to the barrier layer 108, the drain 112 may be electrically coupled to the barrier layer 108, and the gate 114 may be electrically coupled to the barrier layer 108 such that an electric current flows between the source 110 and the drain 112 via a two-dimensional electron gas (2DEG) induced at the heterointerface 152 between the buffer layer 104 and the barrier layer 108 when the gate 114 electrode is biased at an appropriate level. In one aspect, the source 110 may be electrically coupled to the transistor 100, the drain 112 may be electrically coupled to the transistor 100, and the gate 114 may be electrically coupled to the transistor 100 such that an electric current flows between the source 110 and the drain 112 via a two-dimensional electron gas (2DEG) induced at the heterointerface 152 between the buffer layer 104 and the barrier layer 108 when a gate 114 is biased at an appropriate level. In various aspects, the gate 114 may control a flow of electrons in the 2DEG based on a signal and/or bias placed on the gate 114. In this regard, depending on a composition of the layers and/or a doping of the layers, the transistor 100 can be normally on or the transistor 100 can be normally off with no bias or signal on the gate. In one aspect, the heterointerface 152 may be in the range of 0.005 μm to 0.007 μm, 0.007 μm to 0.009 μm, and 0.009 μm to 0.11 μm.

The gate 114 may extend on top of a spacer or the spacer layer 116. The spacer layer 116 may be etched and the gate 114 deposited such that the bottom of the gate 114 is on the surface of barrier layer 108. The metal forming the gate 114 may be patterned to extend across spacer layer 116 so that the top of the gate 114 forms a field plate 132.

Further during some aspects of the process 500 as part of step 512, a second spacer layer 117 may be formed and a field plate 132 may be arranged on top of the second spacer layer 117 and may be separated from the gate 114. In one aspect, the field plate 132 may be deposited on the second spacer layer 117 between the gate 114 and the drain 112. In some aspects, the field plate 132 may include many different conductive materials with a suitable material being a metal, or combinations of metals, deposited using standard metallization methods. In one aspect, the field plate 132 may include titanium, gold, nickel, titanium/gold, nickel/gold, or the like.

In one aspect, the connection 154 may be formed with the field plate 132 during the same manufacturing step (see FIG. 9). In one aspect, a plurality of the field plates 132 may be used. In one aspect, a plurality of the field plates 132 may be used and each of the plurality of field plates 132 may be stacked with a dielectric material therebetween. In one aspect, the field plate 132 extends toward the edge of gate 114 towards the drain 112. In one aspect, the field plate 132 extends towards the source 110. In one aspect, the field plate 132 extends towards the drain 112 and towards the source 110. In another aspect, the field plate 132 does not extend toward the edge of gate 114. Finally, the structure may be covered with a dielectric spacer layer such as silicon nitride. The dielectric spacer layer may also be implemented similar to the spacer layer 116. Moreover, it should be noted that the cross-sectional shape of the gate 114, shown in the Figures is exemplary. For example, the cross-sectional shape of the gate 114 in some aspects may not include the T-shaped extensions. Other constructions of the gate 114 may be utilized.

Further during some aspects of the process 500 as part of step 512, the connection 154 may be formed. In some aspects, the field plate 132 may be electrically connected to the source 110 with the connection 154. In one aspect, the connection 154 may be formed on the second spacer layer 117 to extend between the field plate 132 and the source 110.

It should be noted that the steps of process 500 may be performed in a different order consistent with the aspects described above. Moreover, the process 500 may be modified to have more or fewer process steps consistent with the various aspects disclosed herein. In one aspect of the process 500, the transistor 100 may be implemented with only the conductive material layer 106. In one aspect of the process 500, the transistor 100 may be implemented with the conductive material layer 106 and the conductive material layer 106. In one aspect of the process 500, the transistor 100 may be implemented with only the conductive material layer 106.

Figure 11:
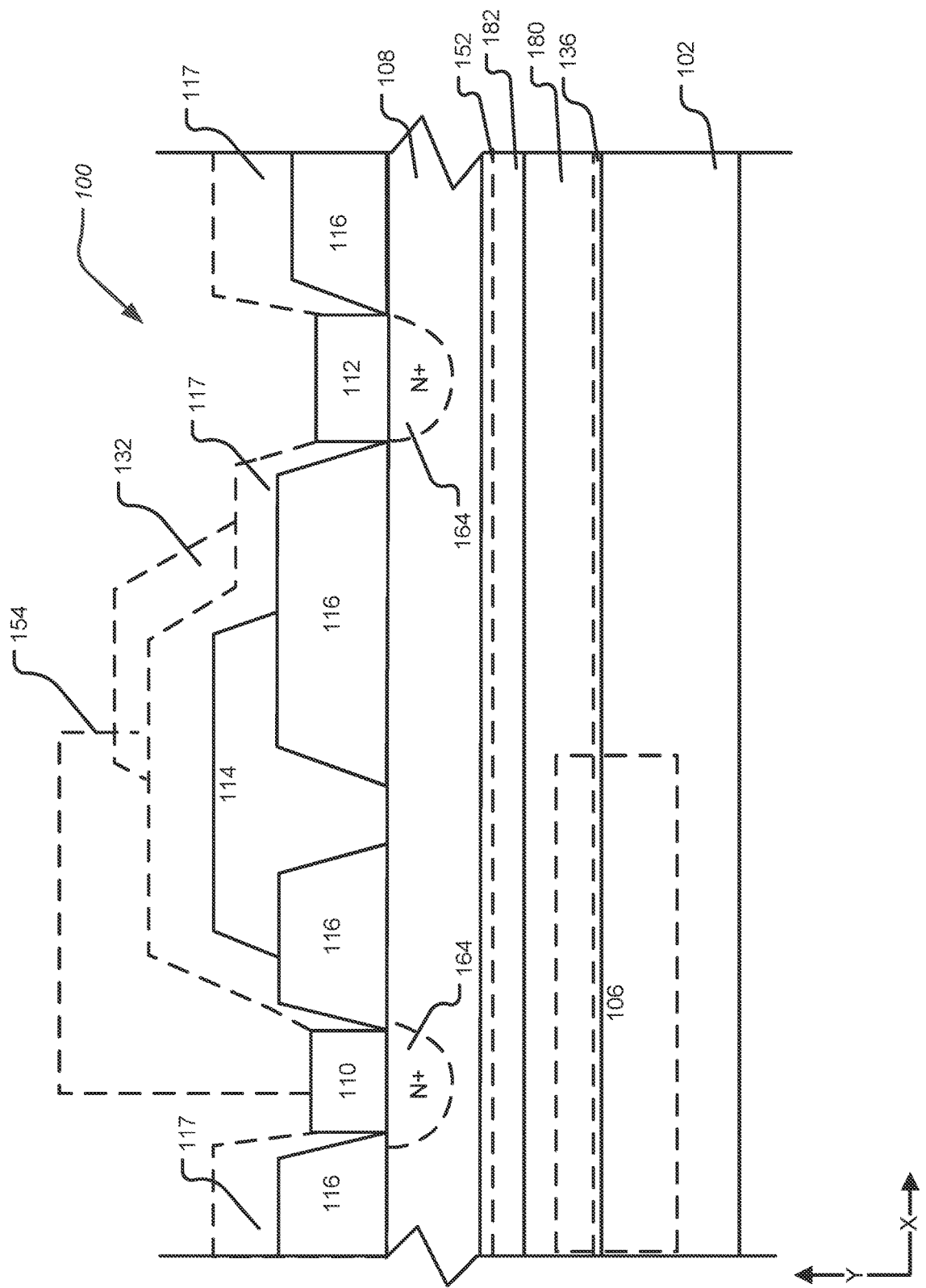
FIG. 11 shows a cross-sectional view of another aspect of a transistor according to the disclosure.

FIG. 11 shows a cross-sectional view of another aspect of a transistor according to the disclosure.

In particular, FIG. 11 illustrates a transistor 100 that may include any one or more aspects of the disclosure described herein. The transistor 100 of FIG. 11 may include the conductive material layer 106 as described above. In particular, FIG. 11 illustrates a transistor 100 that may include any one or more aspects of the disclosure described herein. In particular, the transistor 100 of FIG. 11 may include the conductive material layer 106 as described above. In this regard, the transistor 100 of FIG. 11 implements a length of the conductive material layer 106 as described herein that reduces lag effect, avoids adverse effects on RF performance for certain transistor applications, and/or the like.

Further, FIG. 11 illustrates the transistor 100 implementing a back barrier layer 180 may be formed directly on the nucleation layer 136 or on the nucleation layer 136 with intervening layer(s). In aspects of the transistor 100 of the disclosure, the back barrier layer 180 may be formed directly on the substrate layer 102 or on the substrate layer 102 with intervening layer(s). In particular, the back barrier layer 180 may be configured at least in part as a lag reduction structure, a lag elimination structure, and/or the like. In particular, the back barrier layer 180 configured at least in part as a lag reduction structure, a lag elimination structure, and/or the like in conjunction with the conductive material layer 106 configured at least in part as a drain lag reduction structure, a drain lag elimination structure, and/or the like may operate together in a synergistic manner to reduce overall lag of the transistor 100. As further described herein, this synergistic overall reduction of lag of the transistor 100 was an unexpected result of the combined structures of the back barrier layer 180 and the conductive material layer 106. In the aspects of FIG. 11, the conductive material layer 106 may be formed in one or more of the substrate layer 102, the back barrier layer 180, the channel layer 182, and/or the like.

More specifically, the transistor 100 in conjunction with the conductive material layer 106 and the back barrier layer 180 as disclosed, associated structures thereof, and/or associated processes thereof, may provide a systematic approach to reducing lag. More specifically, the transistor 100 of the disclosure may implement the conductive material layer 106 and/or processes thereof as a drain lag reduction structure and/or process to reduce the drain lag effect and the transistor 100 of the disclosure may implement the back barrier layer 180 and/or processes thereof as a lag reduction structure and/or process to reduce the lag effect.

In this regard, it has been determined that impurities such as silicon, oxygen, carbon, and/or the like in the back barrier layer 180 may increase lag. In particular, that impurities provide trapping, leaking, and/or the like. More specifically, aspects of the disclosure may implement the back barrier layer 180 with low background impurity levels. In one aspect, the disclosure may implement AlGaN for the back barrier layer 180 with low background impurity levels. In this regard, impurities have been found to build complexes with dislocations, such as point defects, which also act as deep trap levels.

More specifically, the disclosure may implement AlGaN for the back barrier layer 180 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 180 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 180 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 180 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

Additionally, the back barrier layer 180 may be configured to provide a sharp interface to the channel layer 182. This interface may function as a barrier for electrons. In aspects of the transistor 100 of the disclosure, the back barrier layer 180 may be a graded layer. In one aspect, the back barrier layer 180 may be a step-graded layer. In one aspect, the back barrier layer 180 may be multiple layers.

In particular aspects, the back barrier layer 180 may be a low Al concentration AlGaN buffer layer to provide a barrier to reduce electron injection into the buffer layer. In this regard, the barrier to reduce electron injection into the buffer layer results in a lag reduction structure, a lag elimination structure, and/or the like. For example, the back barrier layer 180 may be implemented with about 4% Al concentration AlGaN to provide a barrier to reduce electron injection into the buffer. In this regard, about may be within 0.5%, 1%, 1.5%, or 2%. In particular aspects, the back barrier layer 180 may be implemented with AlGaN with an Al concentration of 1% to 6%, 1% to 1.5%, 1.5% to 2%, 2% to 2.5%, 2.5% to 3%, 3% to 3.5%, 3.5% to 4%, 3.5% to 4.5%, 3.8% to 4.2%, 4% to 4.5%, 4.5% to 5%, 5% to 5.5%, or 5.5% to 6%, to provide a barrier to reduce electron injection into the buffer, a lag reduction structure, a lag elimination structure, and/or the like.

In aspects, the transistor 100 may have limited lag during a limited operational envelope. However, the back barrier layer 180 may be configured as a lag reduction, a lag elimination, and/or the like for implementations outside the limited operational envelope where lag trapping effects may be present. In particular, the back barrier layer 180 configured at least in part as a lag reduction structure, a lag elimination structure, and/or the like in conjunction with the conductive material layer 106 configured at least in part as a drain lag reduction structure, a drain lag elimination structure, and/or the like operate together in a synergistic manner to reduce overall lag of the transistor 100 during such low gate voltage conditions. As further described herein, this synergistic overall reduction of lag of the transistor 100 was an unexpected result of the combined structures of the back barrier layer 180 and the conductive material layer 106.

Additionally, the back barrier layer 180 of the transistor 100 may be further configured and/or processed to reduce and/or limit lag effect by implementing epitaxial growth thereof. In particular, the back barrier layer 180 of the transistor 100 may be further configured and/or processed to reduce and/or limit lag effect by implementing epitaxial growth while reducing incorporation of background impurities such as silicon (Si), oxygen (O), carbon (C), and/or the like in the AlGaN of implementations of the back barrier layer 180. More specifically, aspects of the disclosure may implement the back barrier layer 180 with low background impurity levels. In one aspect, the disclosure may implement AlGaN for the back barrier layer 180 with low background impurity levels. In this regard, impurities have been found to build complexes with dislocations, such as point defects, which also act as deep trap levels. In this regard, incorporation in the back barrier layer 180 of a high concentration of high level background impurities has been found to be a problem when using AlGaN for the back barrier layer 180. The back barrier layer 180 may implement epitaxial growth with impurity incorporation significantly reduced. More specifically, the back barrier layer 180 may be implemented with epitaxial growth of AlGaN reducing incorporation of background impurities such as silicon (Si), oxygen (O), carbon (C), and/or the like.

More specifically, the disclosure may implement AlGaN for the back barrier layer 180 with low background impurity levels where low background impurity levels may be defined as impurities less than 1E17 per cubic cm. (centimeter), less than 5E16 per cubic cm., less than 1E16 per cubic cm., or less than 1E15 per cubic cm. Moreover, the disclosure may implement AlGaN for the back barrier layer 180 with low background impurity levels of silicon, oxygen, carbon, and/or the like where low background impurity levels of silicon, oxygen, carbon, and/or the like may be defined as impurities of silicon, oxygen, carbon, and/or the like less than 1E17 per cubic cm. (centimeter), less than 5E16 per cubic cm., less than 1E16 per cubic cm., or less than 1E15 per cubic cm.

Moreover, the disclosure may implement AlGaN for the back barrier layer 180 with low background impurity levels of silicon and oxygen where low background impurity levels of silicon and oxygen may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of silicon and oxygen where low background impurity levels of silicon and oxygen may be defined as impurities of silicon and oxygen less than 1E16. Moreover, the disclosure may implement AlGaN for the back barrier layer 180 with low background impurity levels of carbon where low background impurity levels of carbon may be defined as impurities of silicon, oxygen and carbon less than 1E17 per cubic cm. (centimeter), less than 5E16 per cubic cm., less than 1E16 per cubic cm., or less than 1E15 per cubic cm. In one aspect, low background impurity levels of carbon where low background impurity levels of carbon may be defined as impurities of carbon less than 5E16.

Additionally or alternatively, low background impurity levels may be defined as impurities between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of silicon, oxygen, carbon, and/or the like between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm.

and 1E16 per cubic cm., 1E16 per cubic cm. and 5E16 per cubic cm., or 5E16 per cubic cm. and 1E17 per cubic cm.

In particular, low background impurity levels may be defined as impurities of silicon and oxygen between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm. In particular, low background impurity levels may be defined as impurities of carbon between 1E15 per cubic cm. and 1E17 per cubic cm., 1E15 per cubic cm. and 1E16 per cubic cm., 1E16 per cubic cm. and 5E16 per cubic cm., or 5E16 per cubic cm. and 1E17 per cubic cm.

In this regard, it has been discovered that a source of defects may be impurities, which may act as non-intentional doping and create trap centers and/or the like in the transistor 100. To prevent deep penetration of electrons in the GaN buffer of the transistor 100 or the channel layer 182 of the transistor 100, the back barrier layer 180 may be implemented as an AlGaN buffer as described herein and may be used to confine electrons in the channel layer 182 close to the back barrier layer 180. The disclosed implementation and configuration of the back barrier layer 180 has additionally proven to improve break-down voltage in the transistor 100 and/or GaN HEMT implementations of the transistor 100.

Accordingly, the transistor 100 may include the conductive material layer 106 as described herein in order for drain lag to be greatly reduced and/or eliminated. However, the transistor 100 may still suffer from the lag effect. For example, the transistor 100 may still suffer from the lag effect at elevated negative gate voltages. Traps in the buffer of the transistor 100 may be a cause this delay. Accordingly, the back barrier layer 180 may be implemented with AlGaN with very low background impurity levels of Carbon, Silicon, Oxygen, and/or the like grown on the conductive material layer 106 to dramatically improve the electron confinement and reduce and/or eliminate lag as well as may reduce and/or eliminate overall lag.

In particular aspects, the back barrier layer 180 may include a planar upper surface that is generally parallel to an X axis as illustrated in FIG. 11 and/or is generally parallel to an Z axis (perpendicular to the X axis and the Y axis). In particular aspects, the back barrier layer 180 may include a planar lower surface that is generally parallel to an X axis as illustrated in FIG. 11 and/or is generally parallel to an Z axis (perpendicular to the X axis and the Y axis). Where upper and lower are defined along the Y axis.

In some aspects, a channel layer 182 may be formed directly on the back barrier layer 180 or on the back barrier layer 180 with intervening layer(s). In one aspect, the channel layer 182 is formed of GaN.

Depending on the aspect, the channel layer 182 may be formed of different suitable materials such as a Group III-nitride such as $Al_xGa_yIn_{(1-x-y)}N$ (where $0<=x<=1$, $0<=y<=1$, $x+y<=1$), e.g., GaN, AlGaN, AlN, and the like, or another suitable material. The channel layer 182 or portions thereof may be doped with dopants, such as, Fe and/or C or alternatively can be wholly or partly undoped.

In particular aspects, the channel layer 182 may include a planar upper surface that is generally parallel to an X axis as illustrated in FIG. 11 and/or is generally parallel to an Z axis (perpendicular to the X axis and the Y axis). In particular aspects, the channel layer 182 may include a planar lower surface that is generally parallel to an X axis as illustrated in FIG. 11 and/or is generally parallel to an Z axis (perpendicular to the X axis and the Y axis). Where upper and lower are defined along the Y axis.

In one aspect, the channel layer 182 may be high purity GaN. In one aspect, the channel layer 182 may be high purity GaN that may be a low-doped n-type. In one aspect, a combined thickness of the channel layer 182 and the back barrier layer 180 may have a thickness defined as a distance between an upper surface of the substrate layer 102 and a lower surface of the barrier layer 108. In one aspect, a combined thickness of the channel layer 182 and the back barrier layer 180 along the Y axis between an upper surface of the channel layer 182 and a lower surface the back barrier layer 180 may be 10%-20%, 20%-30%, 30%-40%, 40%-50%, 50%-60%, 60%-70%, 70%-80%, or 80%-90% of a thickness of the substrate layer 102. In one aspect, a combined thickness of the channel layer 182 and the back barrier layer 180 may be less than 0.8 microns, less than 0.7 microns, less than 0.6 microns, less than 0.5 microns, or less than 0.4 microns. In one aspect, a combined thickness of the channel layer 182 and the back barrier layer 180 may have a range of 0.8 microns to 0.6 microns, 0.7 microns to 0.5 microns, 0.6 microns to 0.4 microns, 0.5 microns to 0.3 microns, 0.4 microns to 0.2 microns, or 0.7 microns to 0.3 microns. In one aspect, the back barrier layer 180 may be thicker than the channel layer 182 along the Y axis between an upper surface and lower surface of each. In one aspect, the back barrier layer 180 may be 10%, 20%, 30%, 40%, 50%, 60%, 70%, 80%, 90%, 100%, 120%, 140%, or 160% thicker than the channel layer 182 along the Y axis between an upper surface and lower surface of each. In one aspect, the back barrier layer 180 may be 10%-20%, 20%-30%, 30%-40%, 40%-50%, 50%-60%, 60%-70%, 70%-80%, 80%-90%, 90%-100%, 100%-120%, 120%-140%, or 140%-160% thicker than the channel layer 182 along the Y axis between an upper surface and lower surface of each.

In one aspect, the transistor 100 may have an intervening layer(s) thickness defined as a length between an upper surface of the substrate layer 102 and a lower surface of the barrier layer 108. In one aspect, the intervening layer(s) thickness may be less than 0.8 microns, less than 0.7 microns, less than 0.6 microns, less than 0.5 microns, or less than 0.4 microns. In one aspect, the intervening layer(s) thickness may have a range of 0.8 microns to 0.6 microns, 0.7 microns to 0.5 microns, 0.6 microns to 0.4 microns, 0.5 microns to 0.3 microns, or 0.4 microns to 0.2 microns.

Figure 12:
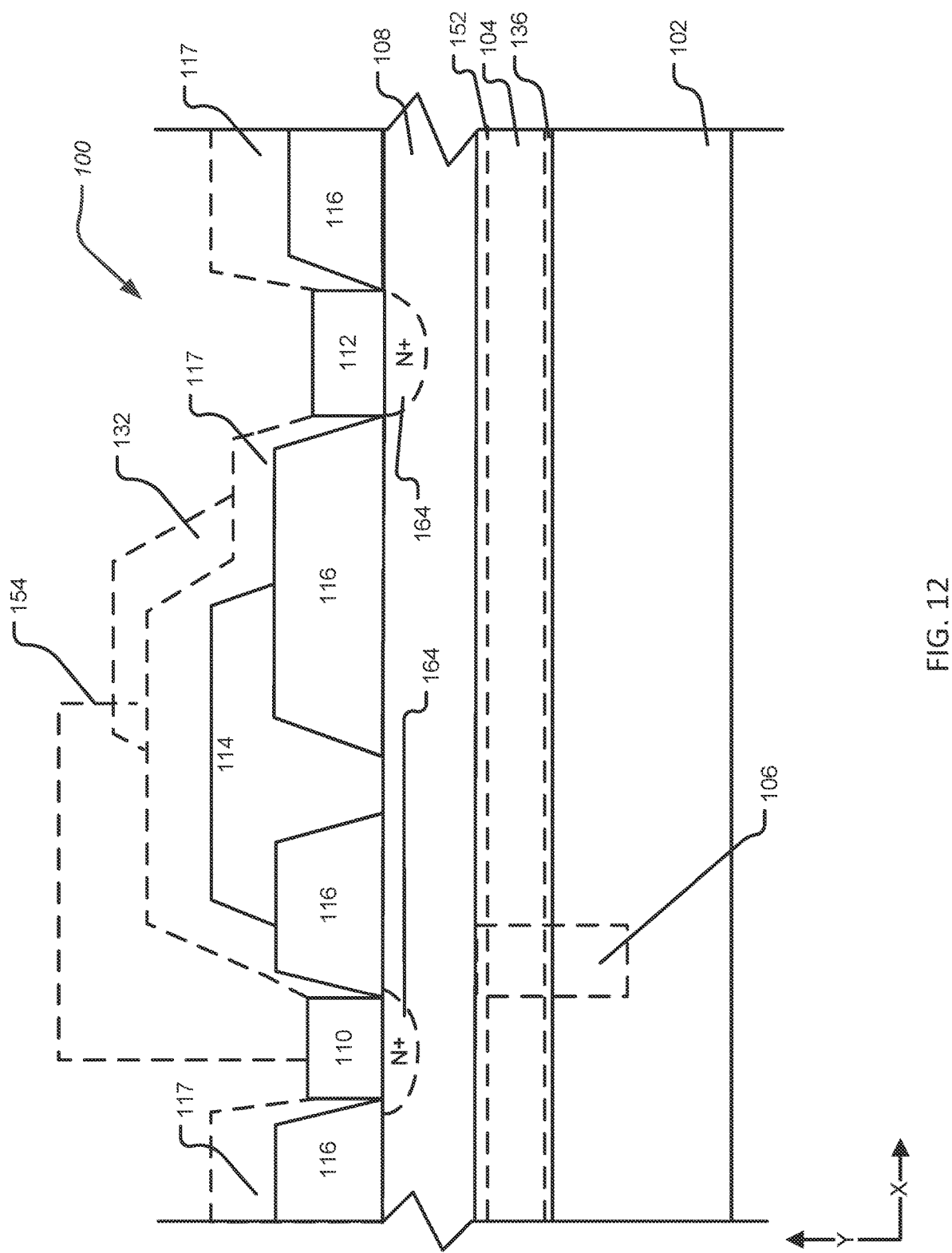
FIG. 12 shows a cross-sectional view of another aspect of a transistor according to the disclosure.

FIG. 12 shows a cross-sectional view of another aspect of a transistor according to the disclosure.

In particular, FIG. 12 illustrates a transistor 100 that may include any one or more aspects of the disclosure described herein. The transistor 100 of FIG. 12 may include the conductive material layer 106 as described above. In particular, FIG. 12 illustrates a transistor 100 that may include any one or more aspects of the disclosure described herein. In particular, the transistor 100 of FIG. 12 may include the conductive material layer 106 as described above. In this regard, the transistor 100 of FIG. 12 implements a length of the conductive material layer 106 as described herein that reduces lag effect, avoids adverse effects on RF performance for certain transistor applications, and/or the like.

Further, FIG. 12 illustrates that the conductive material layer 106 may be structured and arranged to extend between the source 110 and the gate 114 but not overlapping the source 110 and the gate 114. In this regard, overlapping is defined as having portions arranged along the Y axis as illustrated. In this aspect, the conductive material layer 106 may be arranged in the substrate layer 102 and/or the buffer layer 104.

Figure 13:
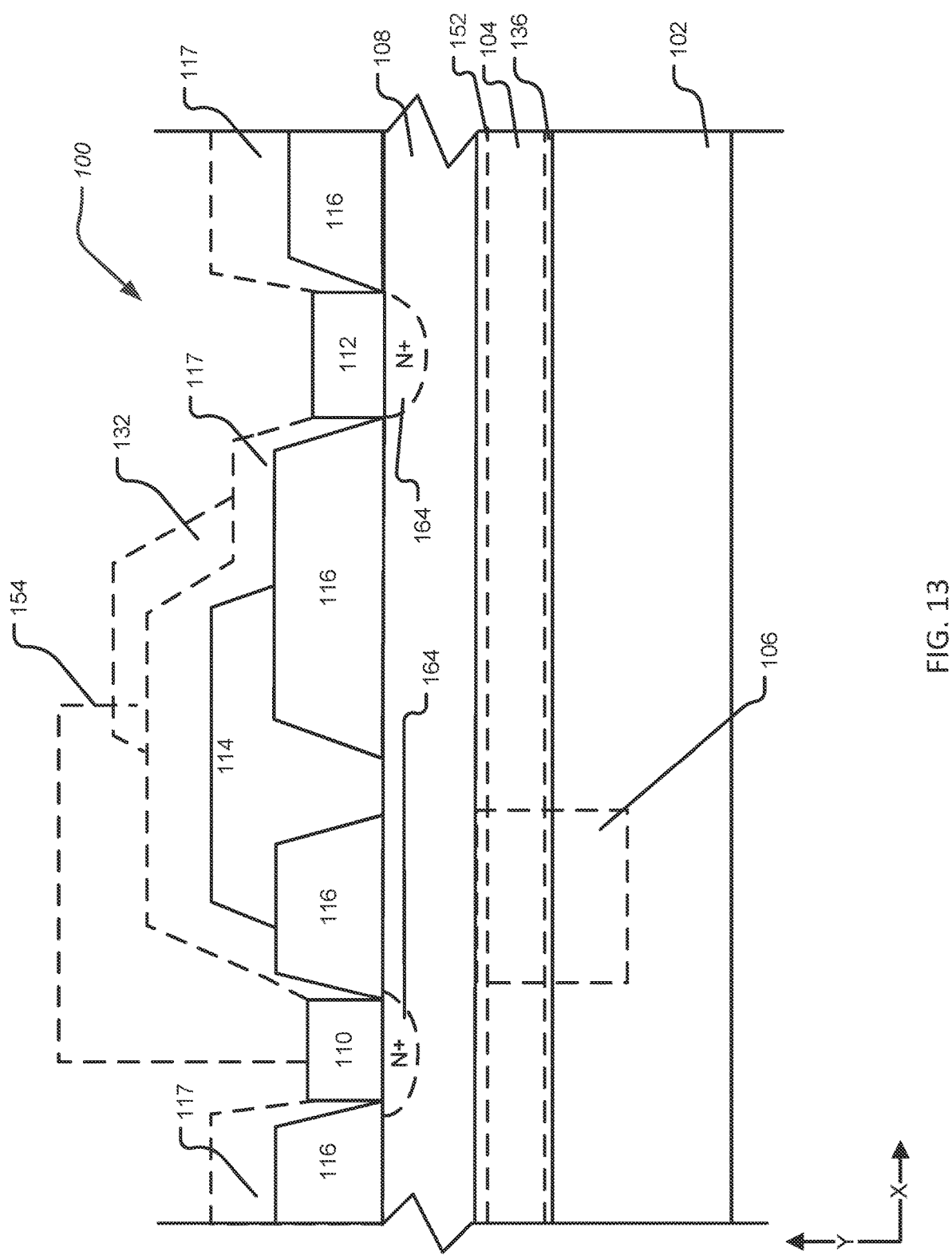
FIG. 13 shows a cross-sectional view of another aspect of a transistor according to the disclosure.

FIG. 13 shows a cross-sectional view of another aspect of a transistor according to the disclosure.

In particular, FIG. 13 illustrates a transistor 100 that may include any one or more aspects of the disclosure described herein. The transistor 100 of FIG. 13 may include the conductive material layer 106 as described above. In particular, FIG. 13 illustrates a transistor 100 that may include any one or more aspects of the disclosure described herein. In particular, the transistor 100 of FIG. 13 may include the conductive material layer 106 as described above. In this regard, the transistor 100 of FIG. 13 implements a length of the conductive material layer 106 as described herein that reduces lag effect, avoids adverse effects on RF performance for certain transistor applications, and/or the like.

Further, FIG. 13 illustrates that the conductive material layer 106 may be structured and arranged to extend between the source 110 and the gate 114 but not overlapping the source 110 and a bottom surface of the gate 114 arranged adjacent the barrier layer 108. In this regard, overlapping is defined as having portions arranged along the Y axis as illustrated. In this aspect, the conductive material layer 106 may be arranged in the substrate layer 102 and/or the buffer layer 104.

Figure 14:
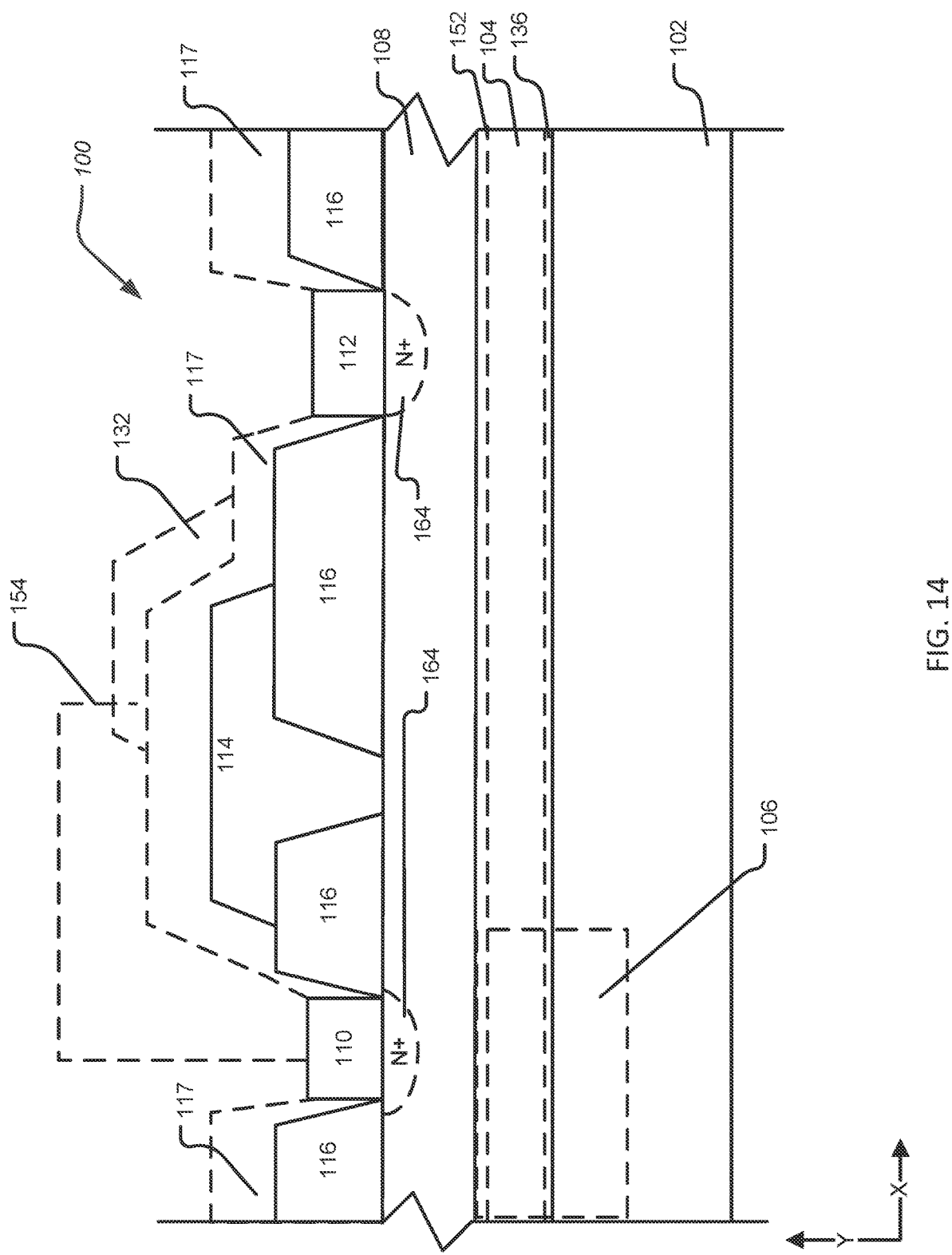
FIG. 14 shows a cross-sectional view of another aspect of a transistor according to the disclosure.

FIG. 14 shows a cross-sectional view of another aspect of a transistor according to the disclosure.

In particular, FIG. 14 illustrates a transistor 100 that may include any one or more aspects of the disclosure described herein. The transistor 100 of FIG. 14 may include the conductive material layer 106 as described above. In particular, FIG. 14 illustrates a transistor 100 that may include any one or more aspects of the disclosure described herein. In particular, the transistor 100 of FIG. 14 may include the conductive material layer 106 as described above. In this regard, the transistor 100 of FIG. 14 implements a length of the conductive material layer 106 as described herein that reduces lag effect, avoids adverse effects on RF performance for certain transistor applications, and/or the like.

Further, FIG. 14 illustrates that the conductive material layer 106 may be structured and arranged to overlap the source 110 but not overlap the gate 114. In this regard, overlapping is defined as having portions arranged along the Y axis as illustrated. In this aspect, the conductive material layer 106 may be arranged in the substrate layer 102 and/or the buffer layer 104.

Figure 15:
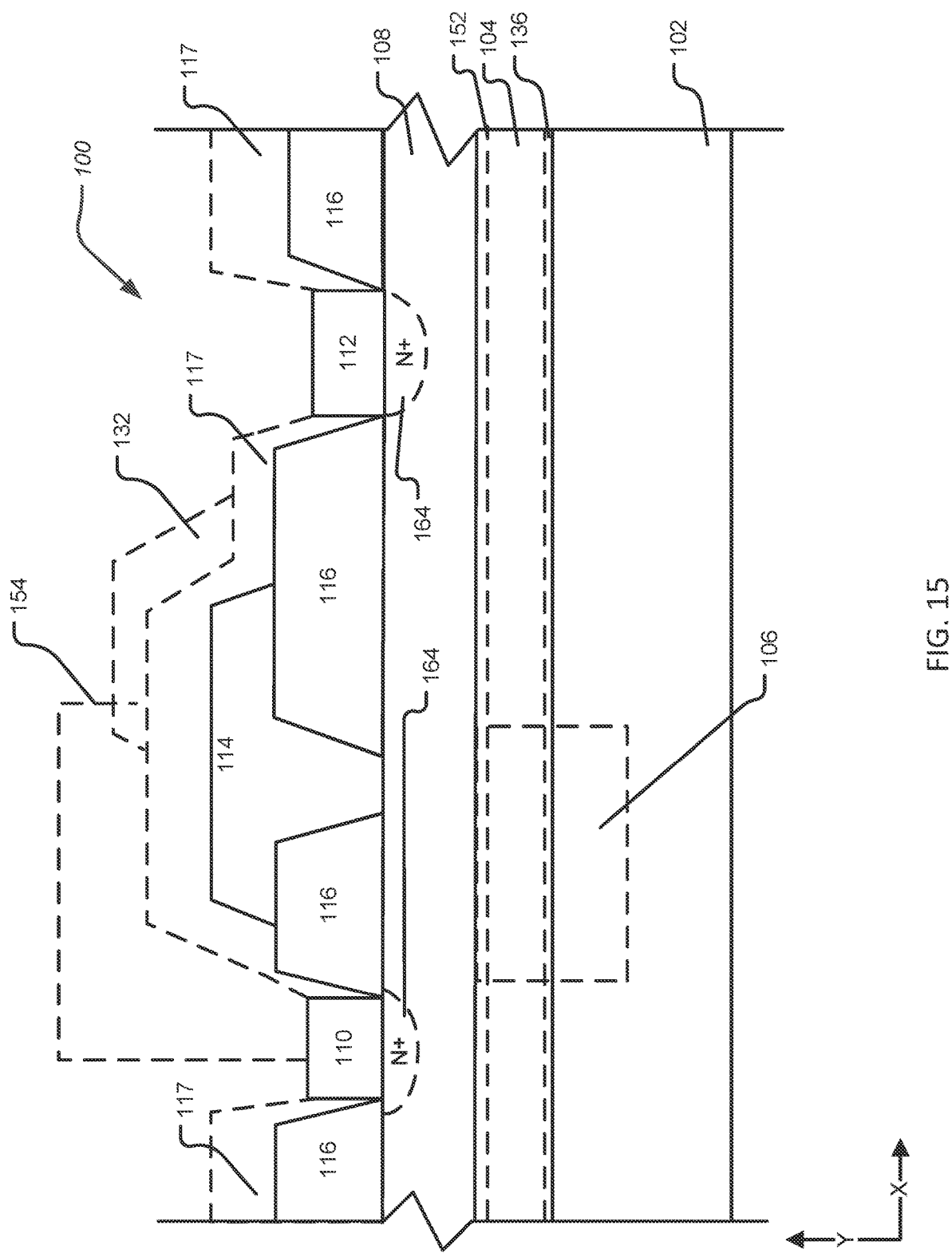
FIG. 15 shows a cross-sectional view of another aspect of a transistor according to the disclosure.

FIG. 15 shows a cross-sectional view of another aspect of a transistor according to the disclosure.

In particular, FIG. 15 illustrates a transistor 100 that may include any one or more aspects of the disclosure described herein. The transistor 100 of FIG. 15 may include the conductive material layer 106 as described above. In particular, FIG. 15 illustrates a transistor 100 that may include any one or more aspects of the disclosure described herein. In particular, the transistor 100 of FIG. 15 may include the conductive material layer 106 as described above. In this regard, the transistor 100 of FIG. 15 implements a length of the conductive material layer 106 as described herein that reduces lag effect, avoids adverse effects on RF performance for certain transistor applications, and/or the like.

Further, FIG. 15 illustrates that the conductive material layer 106 may be structured and arranged to overlap the gate 114 but not the source 110. In this regard, overlapping is defined as having portions arranged along the Y axis as illustrated. In this aspect, the conductive material layer 106 may be arranged in the substrate layer 102 and/or the buffer layer 104.

Figure 16:
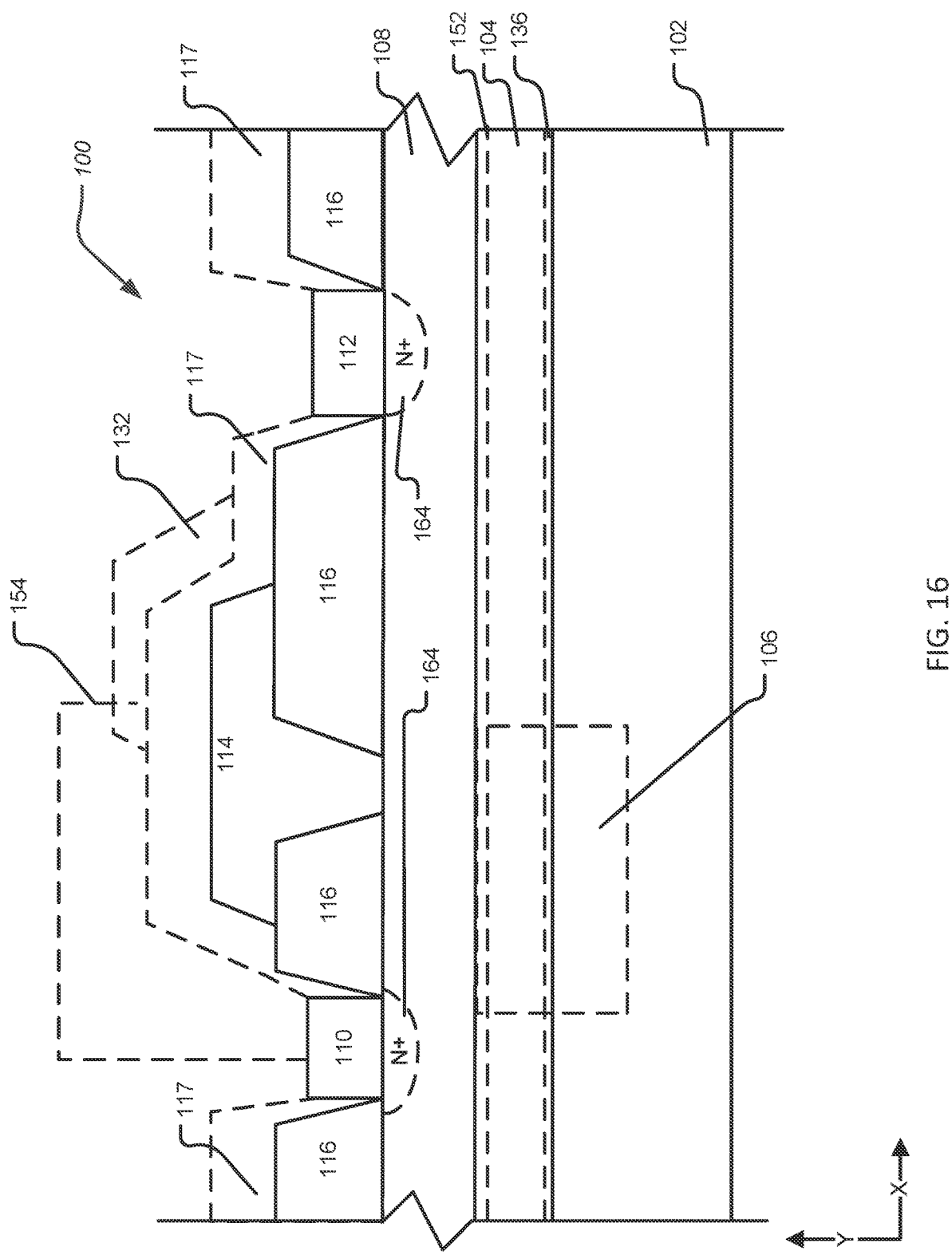
FIG. 16 shows a cross-sectional view of another aspect of a transistor according to the disclosure.

FIG. 16 shows a cross-sectional view of another aspect of a transistor according to the disclosure.

In particular, FIG. 16 illustrates a transistor 100 that may include any one or more aspects of the disclosure described herein. The transistor 100 of FIG. 16 may include the conductive material layer 106 as described above. In particular, FIG. 16 illustrates a transistor 100 that may include any one or more aspects of the disclosure described herein. In particular, the transistor 100 of FIG. 16 may include the conductive material layer 106 as described above. In this regard, the transistor 100 of FIG. 16 implements a length of the conductive material layer 106 as described herein that reduces lag effect, avoids adverse effects on RF performance for certain transistor applications, and/or the like.

Further, FIG. 16 illustrates that the conductive material layer 106 may be structured and arranged to extend past the gate 114 toward the source 110. In aspects, the conductive material layer 106 may overlap the source 110 or may not overlap the source 110. In this regard, overlapping is defined as having portions arranged along the Y axis as illustrated. In this aspect, the conductive material layer 106 may be arranged in the substrate layer 102 and/or the buffer layer 104.

Figure 17:
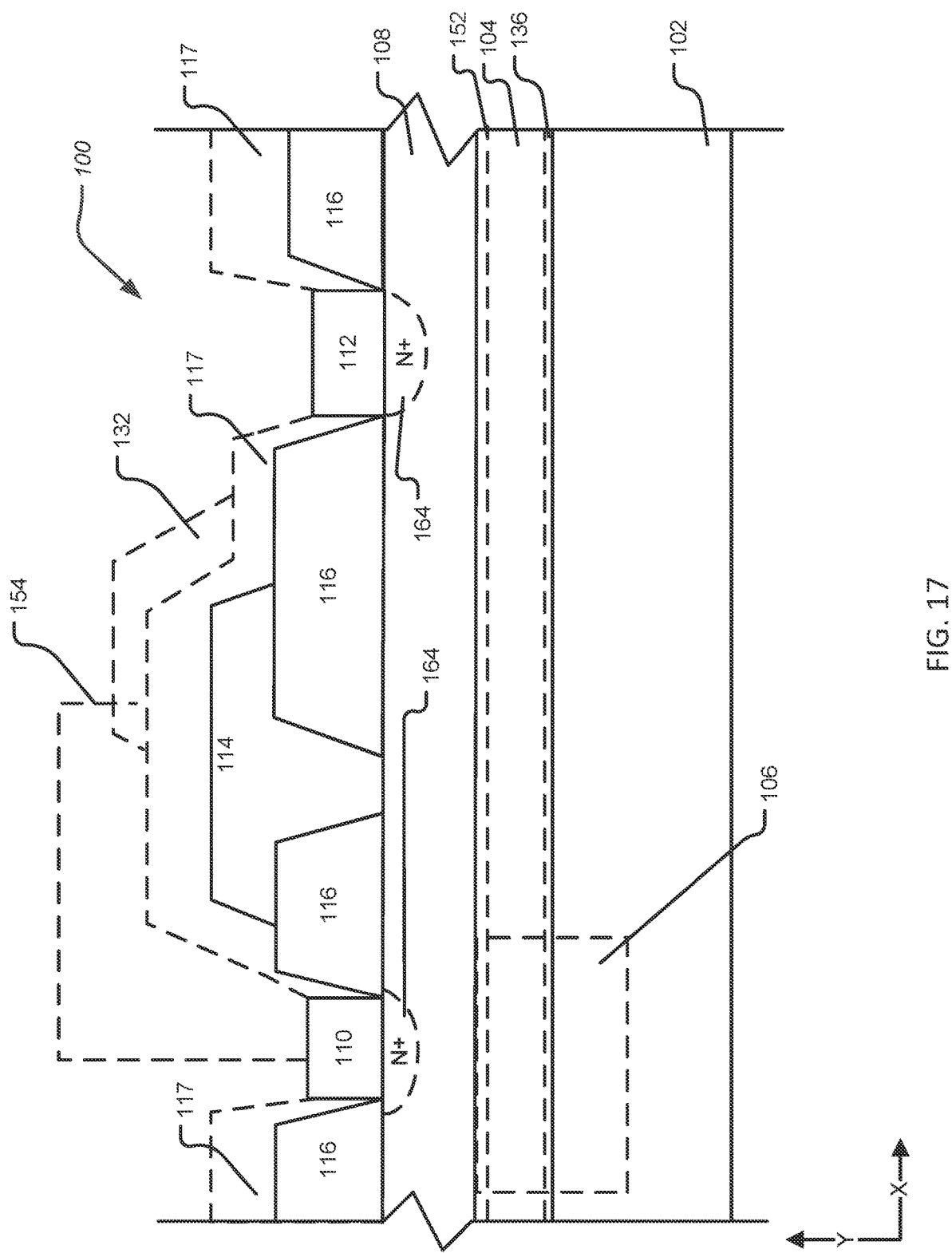
FIG. 17 shows a cross-sectional view of another aspect of a transistor according to the disclosure.

FIG. 17 shows a cross-sectional view of another aspect of a transistor according to the disclosure.

In particular, FIG. 17 illustrates a transistor 100 that may include any one or more aspects of the disclosure described herein. The transistor 100 of FIG. 17 may include the conductive material layer 106 as described above. In particular, FIG. 17 illustrates a transistor 100 that may include any one or more aspects of the disclosure described herein. In particular, the transistor 100 of FIG. 17 may include the conductive material layer 106 as described above. In this regard, the transistor 100 of FIG. 17 implements a length of the conductive material layer 106 as described herein that reduces lag effect, avoids adverse effects on RF performance for certain transistor applications, and/or the like.

Further, FIG. 17 illustrates that the conductive material layer 106 may be structured and arranged to be spaced from an edge of the substrate layer 102 but overlapping the source 110. In aspects, the conductive material layer 106 may overlap the gate 114 or may not overlap the gate 114. In this regard, overlapping is defined as having portions arranged along the Y axis as illustrated. In this aspect, the conductive material layer 106 may be arranged in the substrate layer 102 and/or the buffer layer 104.

Accordingly, the disclosure has presented a solution to addressing lag effect in Group-III nitride HEMTs and improving the performance of such devices. Additionally, the disclosure has presented a solution to addressing traps that cause memory effects that adversely affect performance.

According to aspects of this disclosure, one or more aspects of the transistor 100 as disclosed may be utilized for high power RF (radio frequency) amplifiers, for high power radiofrequency (RF) applications, and also for low frequency high power switching applications. The advantageous electronic and thermal properties of GaN HEMTs also make them very attractive for switching high power RF signals. In this regard, the disclosure has described a structure with a buried conductive material layer under the source region to obtain high breakdown voltage in HEMTs for various applications including power amplifiers while at the same time eliminating drifts in device characteristics arising from trapping in the buffer and/or semi-insulating substrates. Use of buried conductive material layers may also be important in HEMTs for RF switches to obtain high breakdown voltage and good isolation between the input and output.

According to aspects of this disclosure, one or more aspects of the transistor 100 as disclosed may be utilized to implement an amplifier, a radar amplifier, radar components, a microwave radar amplifier, a power module, a gate driver, a component such as a General-Purpose Broadband component, a Telecom component, a L-Band component, a S-Band component, a X-Band component, a C-Band component, a Ku-Band component, a Satellite Communications component, a Doherty configuration, and/or the like. The L band is the Institute of Electrical and Electronics Engineers (IEEE) designation for the range of frequencies in the radio spectrum from 1 to 2 gigahertz (GHz). The S band is a designation by the IEEE for a part of the microwave band of the electromagnetic spectrum covering frequencies from 2 to 4 GHz. The X band is the designation for a band of frequencies in the microwave radio region of the electromagnetic spectrum indefinitely set at approximately 7.0-11.2 GHz. The C-band is the designation given to the radio frequencies from 500 to 1000 MHz. The Ku band is the portion of the electromagnetic spectrum in the microwave range of frequencies from 12 to 18 GHz.

According to aspects of this disclosure, one or more aspects of the transistor 100 as disclosed may be configured in a package and may be implemented as a RF package, a MMIC RF package, and/or the like and may house RF devices. In particular, the RF devices may implement one or more of resistors, inductors, capacitors, Metal-Oxide-Silicon (MOS) capacitors, impedance matching circuits, matching circuits, input matching circuits, output matching circuits, intermediate matching circuits, harmonic filters, harmonic terminations, couplers, baluns, power combiners, power dividers, radio frequency (RF) circuits, radial stub circuits, transmission line circuits, fundamental frequency matching circuits, baseband termination circuits, second order harmonic termination circuits, integrated passive devices (IPD), matching networks, and the like to support various functional technology as input, output, and/or intrastage functions to the package, and/or the like. The package implemented as a MMIC package may further include the transistor 100. The package implemented as a MMIC package may include, connect, support, or the like a radar transmitter, radar transmitter functions, a microwave radar transmitter, microwave radar transmitter functions, a radar receiver, radar receiver functions, a microwave radar receiver, microwave radar receiver functions, and/or the like.

The following are a number of nonlimiting EXAMPLES of aspects of the disclosure. One EXAMPLE includes: EXAMPLE 1. An apparatus includes a substrate; a group III-Nitride buffer layer on the substrate; a group III-Nitride barrier layer on the group III-Nitride buffer layer, the group III-Nitride barrier layer includes a higher bandgap than a bandgap of the group III-Nitride buffer layer; a source electrically coupled to the group III-Nitride barrier layer; a gate electrically coupled to the group III-Nitride barrier layer; a drain electrically coupled to the group III-Nitride barrier layer; and a conductive metallic region being at least one of the following: in the substrate or on the substrate below said group III-Nitride barrier layer, where the conductive metallic region is structured and arranged to extend a limited length parallel to said group III-Nitride barrier layer.

The above-noted EXAMPLE may further include any one or a combination of more than one of the following EXAMPLES: 2. The apparatus of any EXAMPLE herein, where the conductive metallic region is structured and arranged to extend a limited length parallel to said group III-Nitride barrier layer between the source and the gate, but does not overlap the source. 3. The apparatus of any EXAMPLE herein, where the conductive metallic region is structured and arranged to extend a limited length parallel to said group III-Nitride barrier layer to overlap the source, but does not overlap the gate. 4. The apparatus of any EXAMPLE herein, where the conductive metallic region is structured and arranged to extend a limited length parallel to said group III-Nitride barrier layer to extend past the gate toward the source. 5. The apparatus of any EXAMPLE herein, where the conductive metallic region is structured and arranged to extend a limited length parallel to said group III-Nitride barrier layer and be spaced from an edge of the substrate but overlapping the source. 6. The apparatus of any EXAMPLE herein, where the conductive metallic region is electrically coupled to said source. 7. The apparatus of any EXAMPLE herein, where the conductive metallic region is electrically coupled to said gate. 8. The apparatus of any EXAMPLE herein, where the conductive metallic region is in the group III-Nitride buffer layer. 9. The apparatus of any EXAMPLE herein, includes an additional group III-Nitride buffer layer arranged on the conductive metallic region. 10. The apparatus of any EXAMPLE herein, where the conductive metallic region is in the substrate below said group III-Nitride barrier layer. 11. The apparatus of any EXAMPLE herein, where the conductive metallic region includes one of the following: a metal material, a superconducting material, a conductive layer, a metal layer, a superconducting layer, a conductive portion, a metal portion, and/or a superconducting portion. 12. The apparatus of any EXAMPLE herein, where the conductive metallic region includes selectively grown Niobium nitride (NbN). 13. The apparatus of any EXAMPLE herein, where the conductive metallic region includes epitaxial metal layers of Niobium nitride (NbN). 14. The apparatus of any EXAMPLE herein, includes a field plate. 15. The apparatus of any EXAMPLE herein, includes a field plate, where the field plate is electrically coupled to said source.

One EXAMPLE includes: EXAMPLE 16. An apparatus includes a substrate; a group III-Nitride buffer layer on the substrate; a group III-Nitride barrier layer on the group III-Nitride buffer layer, the group III-Nitride barrier layer includes a higher bandgap than a bandgap of the group III-Nitride buffer layer; a source electrically coupled to the group III-Nitride barrier layer; a gate electrically coupled to the group III-Nitride barrier layer; a drain electrically coupled to the group III-Nitride barrier layer; and a superconducting material region being at least one of the following: in the substrate or on the substrate below said group III-Nitride barrier layer, where the superconducting material region is structured and arranged to extend a limited length parallel to said group III-Nitride barrier layer.

The above-noted EXAMPLE may further include any one or a combination of more than one of the following EXAMPLES: 17. The apparatus of any EXAMPLE herein, where the superconducting material region is structured and arranged to extend a limited length parallel to said group III-Nitride barrier layer between the source and the gate, but does not overlap the source. 18. The apparatus of any EXAMPLE herein, where the superconducting material region is structured and arranged to extend a limited length parallel to said group III-Nitride barrier layer to overlap the source, but does not overlap the gate. 19. The apparatus of any EXAMPLE herein, where the superconducting material region is structured and arranged to extend a limited length parallel to said group III-Nitride barrier layer to extend past the gate toward the source. 20. The apparatus of any EXAMPLE herein, where the superconducting material region is structured and arranged to extend a limited length parallel to said group III-Nitride barrier layer and be spaced from an edge of the substrate but overlapping the source. 21. The apparatus of any EXAMPLE herein, where the superconducting material region is electrically coupled to said source. 22. The apparatus of any EXAMPLE herein, where the superconducting material region is electrically coupled to said gate. 23. The apparatus of any EXAMPLE herein, where the superconducting material region is in the group III-Nitride buffer layer. 24. The apparatus of any EXAMPLE herein, includes an additional group III-Nitride buffer layer arranged on the superconducting material region. 25. The apparatus of any EXAMPLE herein, where the superconducting material region is in the substrate below said group III-Nitride barrier layer. 26. The apparatus of any EXAMPLE herein, where the superconducting material region includes one of the following: a metallic material, a superconducting material, a conductive layer, a metallic layer, a superconducting layer, a conductive portion, a metallic portion, and/or a superconducting portion. 27. The apparatus of any EXAMPLE herein, where the superconducting material region includes selectively grown Niobium nitride (NbN). 28. The apparatus of any EXAMPLE herein, where the superconducting material region includes epitaxial metallic layers of Niobium nitride (NbN). 29. The apparatus of any EXAMPLE herein, includes a field plate. 30. The apparatus of any EXAMPLE herein, includes a field plate, where the field plate is electrically coupled to said source.

One EXAMPLE includes: EXAMPLE 31. A method of making a device includes: providing a substrate; providing a group III-Nitride buffer layer on the substrate; providing a group III-Nitride barrier layer on the group III-Nitride buffer layer, the group III-Nitride barrier layer includes a higher bandgap than a bandgap of the group III-Nitride buffer layer; electrically coupling a source to the group III-Nitride barrier layer; electrically coupling a gate to the group III-Nitride barrier layer; electrically coupling a drain to the group III-Nitride barrier layer; and providing a conductive metallic region being at least one of the following: in the substrate or on the substrate below said group III-Nitride barrier layer, where the conductive metallic region is structured and arranged to extend a limited length parallel to said group III-Nitride barrier layer.

The above-noted EXAMPLE may further include any one or a combination of more than one of the following EXAMPLES: 32. The method of making a device of any EXAMPLE herein. 33. The method of making a device of any EXAMPLE herein. 34. The method of making a device of any EXAMPLE herein. 35. The method of making a device of any EXAMPLE herein. 36. The method of making a device of any EXAMPLE herein, includes electrically coupling the conductive metallic region to said source. 37. The method of making a device of any EXAMPLE herein, includes electrically coupling the conductive metallic region to said gate. 38. The method of making a device of any EXAMPLE herein, where the conductive metallic region is in the group III-Nitride buffer layer. 39. The method of making a device of any EXAMPLE herein, includes an additional group III-Nitride buffer layer arranged on the conductive metallic region. 40. The method of making a device of any EXAMPLE herein, where the conductive metallic region is in the substrate below said group III-Nitride barrier layer. 41. The method of making a device of any EXAMPLE herein, where the conductive metallic region includes one of the following: a metallic material, a superconducting material, a conductive layer, a metallic layer, a superconducting layer, a conductive portion, a metallic portion, and/or a superconducting portion. 42. The method of making a device of any EXAMPLE herein, where the conductive metallic region includes Niobium nitride (NbN) and the method includes selectively growing the Niobium nitride (NbN). 43. The method of making a device of any EXAMPLE herein, where the conductive metallic region includes Niobium nitride (NbN) and the method includes growing epitaxial metallic layers of the Niobium nitride (NbN). 44. The method of making a device of any EXAMPLE herein, includes forming a field plate. 45. The method of making a device of any EXAMPLE herein, includes forming a field plate, where the field plate is electrically coupled to said source.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An apparatus, comprising:
a substrate;
a group III-Nitride buffer layer on the substrate;
a group III-Nitride barrier layer on the group III-Nitride buffer layer, the group III-Nitride barrier layer comprising a higher bandgap than a bandgap of the group III-Nitride buffer layer;
a source electrically coupled to the group III-Nitride barrier layer;
a gate coupled to the group III-Nitride barrier layer;
a drain electrically coupled to the group III-Nitride barrier layer; and
a conductive metallic region being at least one of the following: in the substrate or on the substrate below said group III-Nitride barrier layer,
wherein the conductive metallic region is structured and arranged to extend a limited length parallel to said group III-Nitride barrier layer; and
wherein the conductive metallic region comprises selectively grown Niobium nitride (NbN).

2. An apparatus, comprising:
a substrate;
a group III-Nitride buffer layer on the substrate;
a group III-Nitride barrier layer on the group III-Nitride buffer layer, the group III-Nitride barrier layer comprising a higher bandgap than a bandgap of the group III-Nitride buffer layer;
a source electrically coupled to the group III-Nitride barrier layer;
a gate coupled to the group III-Nitride barrier layer;
a drain electrically coupled to the group III-Nitride barrier layer; and
a conductive metallic region being at least one of the following: in the substrate or on the substrate below said group III-Nitride barrier layer,
wherein the conductive metallic region is structured and arranged to extend a limited length parallel to said group III-Nitride barrier layer; and
wherein the conductive metallic region is structured and arranged to extend a limited length parallel to said group III-Nitride barrier layer between the source and the gate, but does not overlap the source.

3. The apparatus of claim 1, wherein the conductive metallic region is structured and arranged to extend a limited length parallel to said group III-Nitride barrier layer to overlap the source, but does not overlap the gate.

4. The apparatus of claim 1, wherein the conductive metallic region is structured and arranged to extend a limited length parallel to said group III-Nitride barrier layer to extend past the gate toward the source.

5. The apparatus of claim 1, wherein the conductive metallic region is structured and arranged to extend a limited length parallel to said group III-Nitride barrier layer and be spaced from an edge of the substrate but overlapping the source.

6. The apparatus of claim 1, wherein the conductive metallic region is electrically coupled to said source.

7. The apparatus of claim 1, wherein the conductive metallic region is electrically coupled to said gate.

8. The apparatus of claim 1, wherein the conductive metallic region is in the group III-Nitride buffer layer.

9. The apparatus of claim 8, further comprising an additional group III-Nitride buffer layer arranged on the conductive metallic region.

10. The apparatus of claim 1, wherein the conductive metallic region is in the substrate below said group III-Nitride barrier layer.

11. The apparatus of claim 2, wherein the conductive metallic region comprises one of the following: a metal material, a superconducting material, a conductive layer, a metal layer, a superconducting layer, a conductive portion, a metal portion, and/or a superconducting portion.

12. The apparatus of claim 2, wherein the conductive metallic region comprises selectively grown Niobium nitride (NbN).

13. An apparatus, comprising:
a substrate;
a group III-Nitride buffer layer on the substrate;
a group III-Nitride barrier layer on the group III-Nitride buffer layer, the group III-Nitride barrier layer comprising a higher bandgap than a bandgap of the group III-Nitride buffer layer:
a source electrically coupled to the group III-Nitride barrier layer;
a gate coupled to the group III-Nitride barrier layer;
a drain electrically coupled to the group III-Nitride barrier layer; and
a conductive metallic region being at least one of the following: in the substrate or on the substrate below said group III-Nitride barrier layer,
wherein the conductive metallic region is structured and arranged to extend a limited length parallel to said group III-Nitride barrier layer; and
wherein the conductive metallic region comprises epitaxial metal layers of Niobium nitride (NbN).

14. The apparatus of claim 1, further comprising a field plate.

15. The apparatus of claim 1, further comprising a field plate, wherein the field plate is electrically coupled to said source.

16. An apparatus, comprising:
a substrate;
a group III-Nitride buffer layer on the substrate;
a group III-Nitride barrier layer on the group III-Nitride buffer layer, the group III-Nitride barrier layer comprising a higher bandgap than a bandgap of the group III-Nitride buffer layer;
a source electrically coupled to the group III-Nitride barrier layer;
a gate coupled to the group III-Nitride barrier layer;
a drain electrically coupled to the group III-Nitride barrier layer; and
a superconducting material region being at least one of the following: in the substrate or on the substrate below said group III-Nitride barrier layer,
wherein the superconducting material region is structured and arranged to extend a limited length parallel to said group III-Nitride barrier layer; and
wherein the superconducting material region comprises selectively grown Niobium nitride (NbN).

17. An apparatus, comprising:
a substrate;
a group III-Nitride buffer layer on the substrate;
a group III-Nitride barrier layer on the group III-Nitride buffer layer, the group III-Nitride barrier layer comprising a higher bandgap than a bandgap of the group III-Nitride buffer layer;
a source electrically coupled to the group III-Nitride barrier layer;
a gate coupled to the group III-Nitride barrier layer;
a drain electrically coupled to the group III-Nitride barrier layer; and
a superconducting material region being at least one of the following: in the substrate or on the substrate below said group III-Nitride barrier layer,
wherein the superconducting material region is structured and arranged to extend a limited length parallel to said group III-Nitride barrier layer; and
wherein the superconducting material region is structured and arranged to extend a limited length parallel to said group III-Nitride barrier layer between the source and the gate, but does not overlap the source.

18. The apparatus of claim 16, wherein the superconducting material region is structured and arranged to extend a limited length parallel to said group III-Nitride barrier layer to overlap the source, but does not overlap the gate.

19. The apparatus of claim 16, wherein the superconducting material region is structured and arranged to extend a limited length parallel to said group III-Nitride barrier layer to extend past the gate toward the source.

20. The apparatus of claim 16, wherein the superconducting material region is structured and arranged to extend a limited length parallel to said group III-Nitride barrier layer and be spaced from an edge of the substrate but overlapping the source.

21. The apparatus of claim 16, wherein the superconducting material region is electrically coupled to said source.

22. The apparatus of claim 16, wherein the superconducting material region is electrically coupled to said gate.

23. The apparatus of claim 16, wherein the superconducting material region is in the group III-Nitride buffer layer.

24. The apparatus of claim 23, further comprising an additional group III-Nitride buffer layer arranged on the superconducting material region.

25. The apparatus of claim 16, wherein the superconducting material region is in the substrate below said group III-Nitride barrier layer.

26. The apparatus of claim 17, wherein the superconducting material region comprises one of the following: a metallic material, a superconducting material, a conductive layer, a metallic layer, a superconducting layer, a conductive portion, a metallic portion, and/or a superconducting portion.

27. The apparatus of claim 17, wherein the superconducting material region comprises selectively grown Niobium nitride (NbN).

28. An apparatus, comprising:
a substrate;
a group III-Nitride buffer layer on the substrate;

a group III-Nitride barrier layer on the group III-Nitride buffer layer, the group III-Nitride barrier layer comprising a higher bandgap than a bandgap of the group III-Nitride buffer layer;
a source electrically coupled to the group III-Nitride barrier layer:
a gate coupled to the group III-Nitride barrier layer;
a drain electrically coupled to the group III-Nitride barrier layer; and
a superconducting material region being at least one of the following: in the substrate or on the substrate below said group III-Nitride barrier layer
wherein the superconducting material region is structured and arranged to extend a limited length parallel to said group III-Nitride barrier layer; and
wherein the superconducting material region comprises epitaxial metallic layers of Niobium nitride (NbN).

29. The apparatus of claim 16, further comprising a field plate.

30. The apparatus of claim 16, further comprising a field plate, wherein the field plate is electrically coupled to said source.

31. The apparatus of claim 1, wherein the conductive metallic region is structured and arranged to extend a limited length parallel to said group III-Nitride barrier layer between the source and the gate, but does not overlap the source.

32. The apparatus of claim 2, further comprising a field plate.

33. The apparatus of claim 13, wherein the conductive metallic region is structured and arranged to extend a limited length parallel to said group III-Nitride barrier layer between the source and the gate, but does not overlap the source.

34. The apparatus of claim 16, wherein the superconducting material region is structured and arranged to extend a limited length parallel to said group III-Nitride barrier layer between the source and the gate, but does not overlap the source.

35. The apparatus of claim 28, wherein the superconducting material region is structured and arranged to extend a limited length parallel to said group III-Nitride barrier layer between the source and the gate, but does not overlap the source.

* * * * *